US012525191B2

(12) United States Patent
Shang et al.

(10) Patent No.: US 12,525,191 B2
(45) Date of Patent: Jan. 13, 2026

(54) DISPLAY SUBSTRATE AND DISPLAY DEVICE

(71) Applicant: BOE TECHNOLOGY GROUP CO., LTD., Beijing (CN)

(72) Inventors: Guangliang Shang, Beijing (CN); Libin Liu, Beijing (CN); Mengyang Wen, Beijing (CN); Jiangnan Lu, Beijing (CN); Li Wang, Beijing (CN); Long Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 462 days.

(21) Appl. No.: 17/778,916

(22) PCT Filed: Jun. 18, 2021

(86) PCT No.: PCT/CN2021/100889

§ 371 (c)(1),
(2) Date: Dec. 22, 2022

(87) PCT Pub. No.: WO2022/261933

PCT Pub. Date: Dec. 22, 2022

(65) Prior Publication Data

US 2024/0169924 A1 May 23, 2024

(51) Int. Cl.

*G09G 3/3266* (2016.01)
*G09G 3/3233* (2016.01)
*H10K 59/131* (2023.01)

(52) U.S. Cl.

CPC ......... *G09G 3/3266* (2013.01); *G09G 3/3233* (2013.01); *H10K 59/131* (2023.02); (Continued)

(58) Field of Classification Search

CPC ......... G09G 3/3266; G09G 2310/0286; G09G 3/3233

See application file for complete search history.

(56) References Cited

U.S. PATENT DOCUMENTS

2015/0364083 A1* 12/2015 Jeon .................... G09G 3/3233 345/76
2018/0190191 A1 7/2018 Zhai et al.
(Continued)

FOREIGN PATENT DOCUMENTS

CN 106952618 A 7/2017
CN 106981268 A 7/2017
(Continued)

*Primary Examiner* — William Boddie
*Assistant Examiner* — Bipin Gyawali
(74) *Attorney, Agent, or Firm* — HOUTTEMAN LAW LLC

(57) ABSTRACT

The embodiments of the present disclosure provides a display substrate, including: an active region and a peripheral region, the active region is provided therein with a plurality of pixel units arranged in an array, all the pixel units are divided into n pixel unit groups, the peripheral region is provided therein with a driver block including a first gate drive circuit having n+x first signal output terminals configured to sequentially output first gate drive signals in an active level and the first gate line provided for an $i^{th}$ pixel unit group is electrically connected to a $(i+x)^{th}$ first signal output terminal, and the reset signal line provided for the $i^{th}$ pixel unit group is electrically connected to an $i^{th}$ first signal output terminal, with i being a positive integer and i≤n.

19 Claims, 15 Drawing Sheets

(52) U.S. Cl.
CPC ............... *G09G 2300/0426* (2013.01); *G09G 2300/0819* (2013.01); *G09G 2300/0852* (2013.01); *G09G 2300/0861* (2013.01); *G09G 2310/0286* (2013.01); *G09G 2310/08* (2013.01); *G09G 2320/0233* (2013.01); *G09G 2320/0257* (2013.01); *G09G 2330/021* (2013.01)

(56) References Cited

U.S. PATENT DOCUMENTS

2020/0005706 A1* 1/2020 Li ...................... G06V 40/1318
2020/0135109 A1 4/2020 Yuan et al.
2020/0226978 A1* 7/2020 Lin ...................... G09G 3/3233
2020/0286570 A1* 9/2020 Shan .................... G09G 3/2092
2021/0304678 A1* 9/2021 Wang ................... H10K 59/131
2021/0366389 A1* 11/2021 Liu ...................... G09G 3/3233
2021/0407386 A1* 12/2021 Li .......................... H10D 86/60
2021/0407424 A1* 12/2021 Long .................... G09G 3/3266
2024/0005858 A1* 1/2024 Zhang .................. G09G 3/3233
2024/0177672 A1* 5/2024 Zhang .................. G09G 3/3233
2025/0148960 A1* 5/2025 Zhong ...................... G09G 3/32
2025/0148975 A1* 5/2025 Zhao .................... G09G 3/3233

FOREIGN PATENT DOCUMENTS

CN 107358920 A 11/2017
CN 107452339 A 12/2017
CN 109285500 A 1/2019
CN 210667751 U 6/2020
CN 111435587 A 7/2020
CN 111477179 A 7/2020
CN 112397026 A 2/2021
WO WO-2019223422 A1 * 11/2019 ........... G09G 3/3233
WO WO 2020194647 A1 10/2020
WO WO 2021081990 A1 5/2021

* cited by examiner

DISPLAY SUBSTRATE AND DISPLAY DEVICE

TECHNICAL FIELD

The present disclosure relates to the field of display technology, and in particular, to a display substrate and a display device.

BACKGROUND

Electroluminescent diodes such as Organic Light Emitting Diodes (OLEDs) and Quantum Dot Light Emitting Diodes (QLEDs) have the advantages such as self-luminescence and low energy consumption, and are one of current hotspots in the research of the application of electroluminescent display devices.

SUMMARY

In a first aspect, embodiments of the present disclosure provide a display substrate, including: an active region and a peripheral region surrounding the active region, wherein the active region is provided therein with a plurality of pixel units arranged in an array, all of the plurality of pixel units are divided into n pixel unit groups, each of the n pixel unit groups is provided with a corresponding first gate line and a corresponding reset signal line, the peripheral region is provided therein with a driver block including a first gate drive circuit, and the first gate drive circuit includes n+x first signal output terminals capable of sequentially outputting first gate drive signals in an active level, with both n and x being positive integers, and x≥2; and the first gate line provided for an $i^{th}$ pixel unit group is electrically connected to a $(i+x)^{th}$ first signal output terminal, and the reset signal line provided for the $i^{th}$ pixel unit group is electrically connected to an $i^{th}$ first signal output terminal, with i being a positive integer and i<n.

In some embodiments, the first gate drive circuit includes: n+x cascaded first shift registers; and a signal output terminal of a first shift register in a $j^{th}$ stage is a $j^{th}$ first signal output terminal, with j being a positive integer and j≤n+x.

In some embodiments, each pixel unit group is provided with a corresponding second gate line, and the driver block further includes: a second gate drive circuit, which is provided with n/a second signal output terminals capable of sequentially outputting second gate drive signals in an active level, with a being a positive integer, a<n, and n/a being a positive integer; and the second gate line provided for the $i^{th}$ pixel unit group is electrically connected to a $\lceil i/a \rceil^{th}$ second signal output terminal, with $\lceil i/a \rceil$ representing rounding up an operation result of i/a.

In some embodiments, the second gate drive circuit includes n/a cascaded second shift registers; and a signal output terminal of the second shift register in a $k^{th}$ stage is a $k^{th}$ second signal output terminal, with k being a positive integer and k≤n/a.

In some embodiments, an interval between a time when one of two adjacent first signal output terminals starts to output the first gate drive signal in an active level and a time when the other one of the two adjacent first signal output terminals successively starts to output the first gate drive signal in an active level is H, and an interval between a time when one of two adjacent second signal output terminals starts to output the second gate drive signal in an active level and a time when the other one of the two adjacent second signal output terminals successively starts to output the second gate drive signal in an active level is a*H; and the first gate drive signal is a single pulse signal/monopulse signal, and duration when the first gate drive signal is in an active level during one period is t, and H≥t.

In some embodiments, in a same frame, a time period during which the second gate drive signal output by the $k^{th}$ second signal output terminal is in an active level at least partially overlaps with a time period during which the first gate drive signal output by each of a $(a*k-a+1)^{th}$ first signal output terminal to a $(a*k)^{th}$ first signal output terminal is in an active level, and also at least partially overlaps with a time period during which the first gate drive signal output by each of a $(a*k-a+1+x)^{th}$ first signal output terminal to a $(a*k+x)^{th}$ first signal output terminal is in an active level.

In some embodiments, in a same frame, a time when the $k^{th}$ second signal output terminal starts to output the second gate drive signal in an active level is prior to a time when the $(a*k-a+1)^{th}$ first signal output terminal starts to output the first gate drive signal in an active level.

In some embodiments, in a same frame, a time when the $k^{th}$ second signal output terminal starts to output the second gate drive signal in an active level is the same as the time when the $(a*k-a+1)^{th}$ first signal output terminal starts to output the first gate drive signal in an active level.

In some embodiments, the second gate drive signal is a monopulse signal during a frame; and duration when the second gate drive signal is in an active level during one period is (x+a)*H.

In some embodiments, the second gate drive signal is a double-pulse signal during a frame; in one period, the double-pulse signal includes a first part in an active level, a second part in an inactive level and a third part in an active level, and the second part is between the first part and the third part; in a same frame, a time period corresponding to the first part of the second gate drive signal output by the $k^{th}$ second signal output terminal at least partially overlaps with the time period during which the first gate drive signal output by each of the $(a*k-a+1)^{th}$ first signal output terminal to the $(a*k)^{th}$ first signal output terminal is in an active level; and a time period corresponding to a third part of the second gate drive signal output by the $k^{th}$ second signal output terminal at least partially overlaps with the time period during which the first gate drive signal output by each of the $(a*k-a+1+x)^{th}$ first signal output terminal to the $(a*k+x)^{th}$ first signal output terminal is in an active level.

In some embodiments, duration of each of the first part and the third part is greater than or equal to a*H.

In some embodiments, a value of a is 1 or 2.

In some embodiments, the value of a is 2, x>4, and the duration of each of the first part and the third part is 3H.

In some embodiments, each pixel unit group is provided with a corresponding light emission control line, the driver block further includes: a light emission control drive circuit having n/b third signal output terminals capable of sequentially outputting light emission control signals in an active level, with b being a positive integer, b<n, and n/b being a positive integer; and the light emission control line provided for the $i^{th}$ pixel unit group is electrically connected to a $\lceil i/b \rceil^{th}$ third signal output terminal, with $\lceil i/b \rceil$ representing rounding up an operation result of i/b (i.e., the smallest integer larger than i/b).

In some embodiments, the light emission control drive circuit includes n/b cascaded third shift registers; and a signal output terminal of the third shift register in a $p^{th}$ stage is a $p^{th}$ third signal output terminal, with p being a positive integer and p≤n/b.

In some embodiments, the interval between a time when one of two adjacent first signal output terminals starts to output the first gate drive signal in an active level and a time when the other one of the two adjacent first signal output terminals successively starts to output the first gate drive signal in an active level is H, and an interval between a time when one of two adjacent third signal output terminals starts to output a light emission control signal in an active level and a time when the other one of the two adjacent third signal output terminals successively starts to output the light emission control signal in an active level is b*H; and the first gate drive signal is a monopulse signal, and the duration when the first gate drive signal is in an active level during one period is t, and H≥t.

In some embodiments, in a same frame, a time period during which the light emission control signal output by the $p^{th}$ third signal output terminal is in an inactive level overlaps with an entire time period from a time when a $(b*p-b+1)^{th}$ first signal output terminal starts to output the first gate drive signal in an active level to a time when a $(b*p+x)^{th}$ first signal output terminal stops outputting the first gate drive signal in an active level.

In some embodiments, the light emission control signal is a monopulse signal; and duration when the light emission control signal is in an inactive level during one period is greater than or equal to (x+b)*H.

In some embodiments, a value of b is 1 or 2.

In some embodiments, the display substrate includes two driver blocks, and the two driver blocks are respectively located on opposite sides of the active region.

In some embodiments, the pixel units in a same row are located in a same/one pixel unit group, and the pixel units in different rows are located in different pixel unit groups.

In some embodiments, the each pixel unit includes: a pixel circuit and a light emitting device, and the pixel circuit includes: a first reset sub-circuit, a second reset sub-circuit, a data write sub-circuit, a threshold compensation sub-circuit, and a driving transistor; the first reset sub-circuit is connected to a first reset power terminal, a control electrode of the driving transistor, and a reset signal line respectively, and is configured to write a first reset voltage provided by the first reset power terminal to a gate electrode of the driving transistor under the control of the reset signal line; the second reset sub-circuit is connected to a first reset power terminal, a first terminal of the light emitting device, and a reset signal line, and is configured to write a second reset voltage provided by the second reset power terminal to the first terminal of the light emitting device under the control of the reset signal line; the data write sub-circuit is connected to a first electrode of the driving transistor, a data line, and a first gate line respectively, and is configured to write a data voltage provided by the data line to the first electrode of the driving transistor under the control of the first gate line; the threshold compensation sub-circuit is connected to a second operating power terminal, the control electrode of the driving transistor, the first electrode of the driving transistor, a second electrode of the driving transistor, and a first gate line respectively, and is configured to write a data compensation voltage, which is equal to a sum of the data voltage and a threshold voltage of the driving transistor, to the control electrode of the driving transistor under control of the first gate line; the second electrode of the driving transistor is connected to the first terminal of the light emitting device, and the driving transistor is configured to output a driving current under the control of the data compensation voltage; and a second terminal of the light emitting device is connected to a first operating power terminal.

In some embodiments, the first reset sub-circuit includes a first transistor, the second reset sub-circuit includes a second transistor, the data write sub-circuit includes a third transistor, and the threshold compensation sub-circuit includes a fourth transistor and a fifth transistor; a control electrode of the first transistor is connected to the reset signal line, a first electrode of the first transistor is connected to the first reset power terminal, and a second electrode of the first transistor is connected to the control electrode of the driving transistor; a control electrode of the second transistor is connected to the reset signal line, a first electrode of the second transistor is connected to the second reset power terminal, and a second electrode of the second transistor is connected to the first terminal of the light emitting device; a control electrode of the third transistor is connected to the first gate line, a first electrode of the third transistor is connected to the data line, and a second electrode of the third transistor is connected to the first electrode of the driving transistor; a control electrode of the fourth transistor is connected to a light emission control signal line, a first electrode of the fourth transistor is connected to the second operating power terminal, and a second electrode of the fourth transistor is connected to the first electrode of the driving transistor; and a control electrode of the fifth transistor is connected to the first gate line, a first electrode of the fifth transistor is connected to the control electrode of the driving transistor, and a second electrode of the fifth transistor is connected to the second electrode of the driving transistor.

In some embodiments, the pixel circuit further includes: a sixth transistor, through which the second electrode of the driving transistor is connected to the first terminal of the light emitting device; and a control electrode of the sixth transistor is connected to the light emission control signal line, a first electrode of the sixth transistor is connected to the second electrode of the driving transistor, and a second electrode of the sixth transistor is connected to the first terminal of the light emitting device.

In some embodiments, the pixel circuit further includes: a seventh transistor, and the first electrode of the fifth transistor and the second electrode of the first transistor are both connected to the control electrode of the driving transistor through the seventh transistor; and a control electrode of the seventh transistor is connected to a second gate line, a first electrode of the seventh transistor is connected to the first electrode of the fifth transistor and the second electrode of the first transistor, and a second electrode of the seventh transistor is connected to the control electrode of the driving transistor.

In some embodiments, the seventh transistor is an N-type transistor, and the remaining transistors in the pixel circuit except for the seventh transistor are all P-type transistors.

In a second aspect, the embodiments of the present disclosure provide a display device, including the display substrate provided in the first aspect.

DETAIL DESCRIPTION OF EMBODIMENTS

Figure 1:
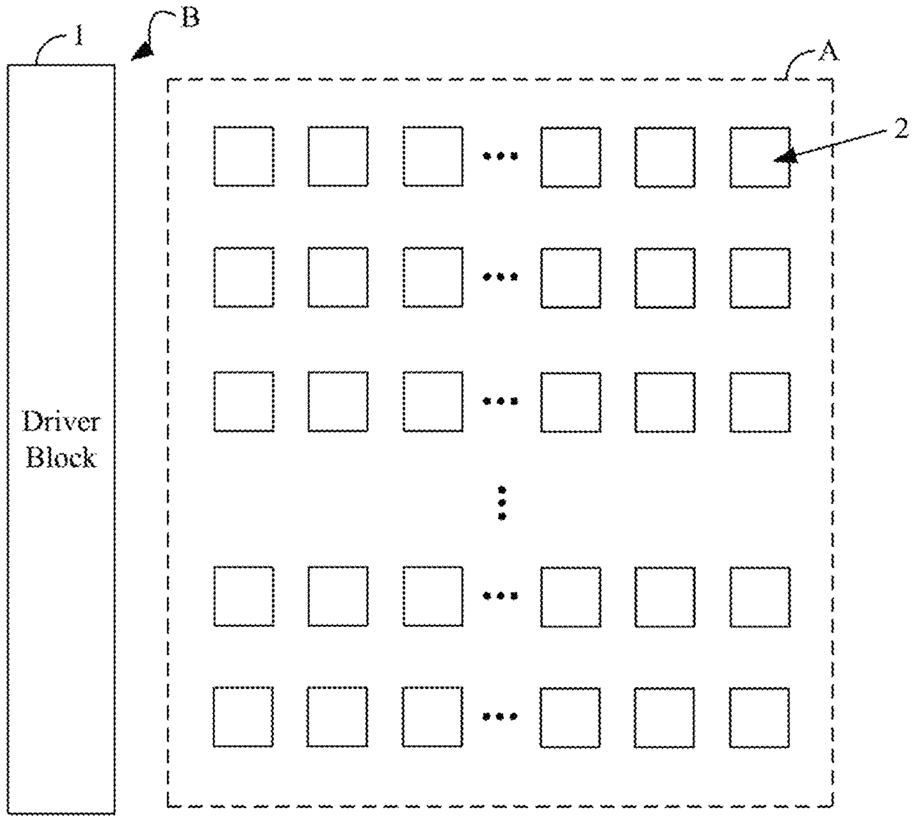
FIG. 1 is a schematic diagram showing a structure of a display substrate according to the present disclosure.

In order to make the objectives, technical solutions and advantages of the present disclosure clearer, the technical solutions of the embodiments of the present disclosure are clearly and thoroughly described below with reference to the drawings of the embodiments of the present disclosure. Apparently, the embodiments described herein are merely some embodiments of the present disclosure, and do not cover all embodiments. The embodiments of the present disclosure and technical features therein can be combined with one another if no conflict is incurred. All other embodiments derived by those of ordinary skill in the art from the described embodiments of the present disclosure without creative work fall within the scope of the present disclosure.

Unless otherwise defined, technical terms or scientific terms used herein should have general meanings that are understood by those of ordinary skill in the technical field of the present disclosure. The words "first", "second" and the like used herein do not denote any order, quantity or importance, but are just used to distinguish between different components. The words "include", "comprise" and the like indicate that an element or object before the words covers the elements or objects or the equivalents thereof listed after the words, rather than excluding other elements or objects. The words "connect", "couple" and the like are not restricted to physical or mechanical connection, but may also indicate electrical connection, whether direct or indirect.

It should be noted that the transistors adopted in the embodiments of the present disclosure may be thin film transistors, field effect transistors, or other devices having the same or similar characteristics. Since a source electrode and a drain electrode of a transistor adopted are symmetrical, there is no difference between the source electrode and the drain electrode. In the embodiments of the present disclosure, in order to distinguish between the source electrode and the drain electrode of the transistor, one of the source electrode and the drain electrode is referred to as a first electrode, the other one of the source electrode and the drain electrode is referred to as a second electrode, and a gate electrode is referred to as a control electrode. In addition, the transistors can be divided into N-type transistors and P-type transistors according to their characteristics. In a case where a P-type transistor is adopted, a first electrode is a drain electrode of the P-type transistor, and a second electrode is a source electrode of the P-type transistor; and in a case where an N-type transistor is adopted, a first electrode is a source electrode of the N-type transistor, and a second electrode is a drain electrode of the N-type transistor. An "active level" in the present disclosure refers to a level, under the control of which a corresponding transistor is controlled to be turned on; and specifically, for the P-type transistor, a corresponding active level is a low level; for the N-type transistor, a corresponding active level is a high level.

FIG. 1 is a schematic diagram showing a structure of a display substrate according to the present disclosure. As shown in FIG. 1, the display substrate includes: an active region A (also referred to as a display active region or an AA region) and a peripheral region B surrounding the active region A. The peripheral region B is provided with a driver block 1 therein, and the active region A is provided therein with a plurality of pixel units 2 arranged in an array. Each of the pixel units 2 includes a pixel circuit and a light emitting device. The pixel circuit includes a transistor and a capacitor, and is configured to generate an electrical signal (i.e., a driving current) under the action of the transistor and the capacitor, and output the electrical signal to the light emitting device to drive the light emitting device to emit light.

The pixel circuit 2 at least includes a driving transistor, a reset circuit, and a data write circuit; in general, a reset voltage is first written, by the reset circuit, to a control electrode of the driving transistor, and then a data voltage is written, by the data write circuit, to the control electrode of the driving transistor, so as to control magnitude of a driving current output by the driving transistor. the reset circuit writes the reset voltage to the control electrode of the driving transistor, so as to improve or eliminate the difference in bias effects of different display brightnesses on the drive transistor, and so as to solve a problem of residual image caused by the difference in the bias effects.

In the related art, since writing of the data voltage is carried out immediately after the reset voltage is written to the control electrode of the driving transistor, the reset voltage is written to the control electrode of the driving transistor for a relatively short time (generally, less than 10 us), resulting in an unobvious effect of eliminating the difference in the bias effects of the different display brightnesses on the driving transistor, so that obvious residual image still exists during a display process.

In order to solve the problem of residual image caused by the difference in the bias effects of the different display brightnesses on the driving transistor in the related art, the present disclosure provides a display substrate and a display device, and an inventive principle of the present disclosure will be described in detail below in conjunction with the embodiments.

Figure 2:
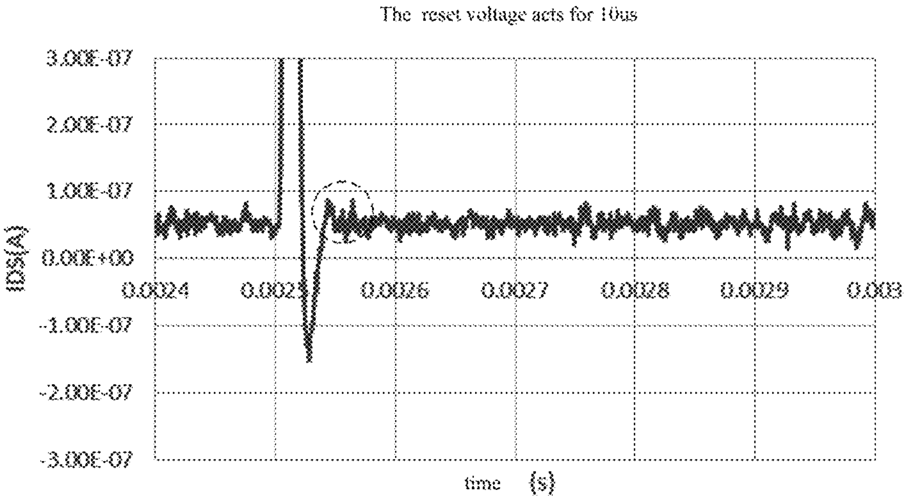
FIG. 2 is a schematic diagram showing a driving current output by a driving transistor when a data voltage is written after a reset voltage is supplied to the control electrode of the driving transistor for 10 us.
Figure 3:
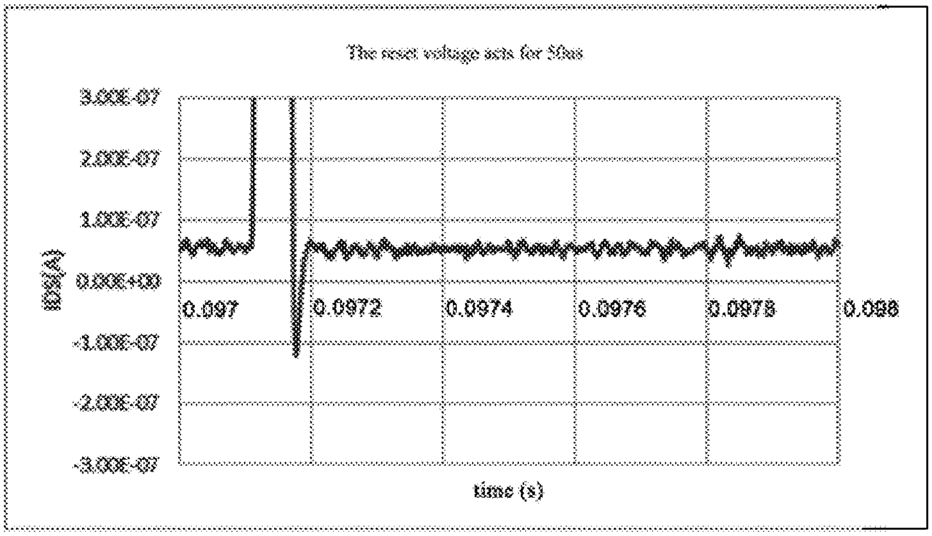
FIG. 3 is a schematic diagram showing a driving current output by a driving transistor when a data voltage is written after a reset voltage is supplied to the control electrode of the driving transistor for 50 us.

FIG. 2 is a schematic diagram showing a driving current output by the driving transistor when the data voltage is written after the reset voltage is supplied to the control electrode of the driving transistor for 10 us. As shown in FIG. 2, the data voltage is written after the reset voltage is supplied to the control electrode of the driving transistor for 10 us, at this time, the driving current output by the driving transistor shifts greatly during an initial stage of the outputting process (shown by the dotted line). FIG. 3 is a schematic diagram showing a driving current output by the driving transistor when the data voltage is written after the reset voltage is supplied to the control electrode of the driving transistor for 50 us. As shown in FIG. 3, the data voltage is written after the reset voltage is supplied to the control electrode of the driving transistor for 50 us, at this time, the driving current output by the driving transistor remains almost unchanged. As can be seen from a comparison between FIG. 2 and FIG. 3, the time for which the reset voltage is supplied to the control electrode of the driving transistor is prolonged, the difference in the bias effects of the different display brightnesses on the driving transistor can be improved or even eliminated, and thus the residual image can be effectively improved or even eliminated.

Figure 4:
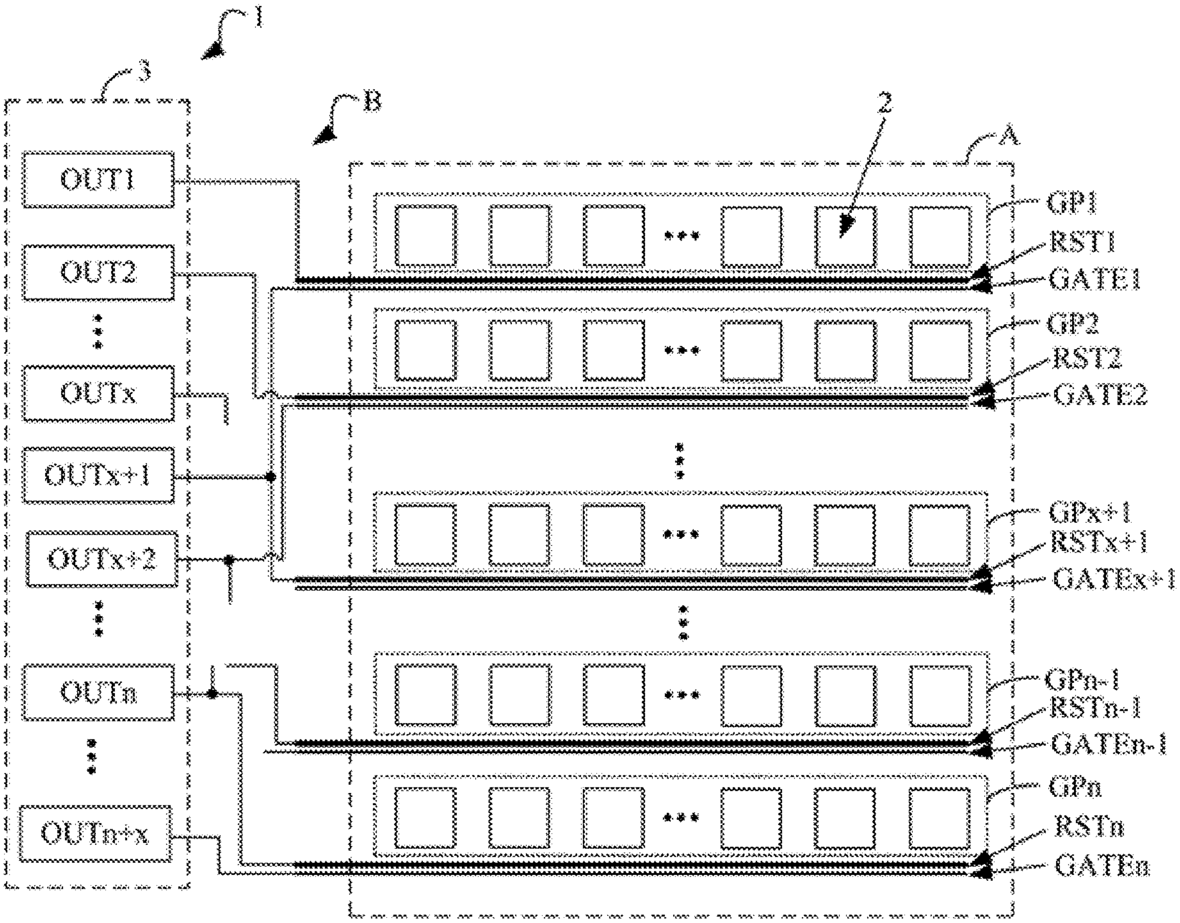
FIG. 4 is a schematic diagram showing a structure of a display substrate according to an embodiment of the present disclosure.

Based on the above principle, the present disclosure provides a display substrate. FIG. 4 is a schematic diagram showing a strcture of a display substrate according to the embodiments of the present disclosure. As shown in FIG. 4, the display substrate includes: an active region A and a peripheral region B surrounding the active region A. The active region A is provided therein with a plurality of pixel units 2 arranged in an array, all the pixel units are divided into n pixel unit groups GP1 to GPn, and the pixel unit groups GP1 to GPn are provided with corresponding first gate lines GATE1 to GATEn and corresponding reset signal lines RST1 to RSTn, respectively; the first gate lines GATE1-GATEn for the pixel unit groups may be configured to control writing of a data voltage to the corresponding pixel units 2, and the reset signal lines RST1-RSTn for the pixel unit groups may be configured to control writing of a reset voltage to the corresponding pixels.

The peripheral region B is provided with a driver block 1 therein, which includes: a first gate drive circuit 3 including (n+x) first signal output terminals OUT1 to OUT(n+x) configured to sequentially output first gate drive signals having an active level, with both n and x being positive integers, and x≥2; and the first gate line GATEi for an $i^{th}$ pixel unit group GPi is electrically connected to a $(i+x)^{th}$ first signal output terminal OUT(i+x), and the reset signal line RSTi for the $i^{th}$ pixel unit group GPi is electrically connected to an $i^{th}$ first signal output terminal OUTi, with i being a positive integer and i≤n.

In the embodiments of the present disclosure, the first gate drive circuit 3 provides corresponding drive signals for the reset signal lines RST1 to RSTn and also provides corresponding drive signals for the first gate lines GATE1 to GATEn. Compared with a conventional technical solution in which one type of signal lines is provided with one drive circuit, the technical solution of the present disclosure can reduce the number of the drive circuits arranged in the peripheral region, thereby facilitating a design of narrow bezels of products.

In some embodiments, the pixel units 2 in a same row are located in one of the pixel unit groups, and the pixel units 2 in different rows are located in different pixel unit groups.

In the embodiments of the present disclosure, two adjacent first signal output terminals sequentially output corresponding first gate drive signals having an active level at a time interval of H. For any one of the pixel units, a time when the reset signal line provided for the pixel unit receives the first gate drive signal having an active level is prior to a time when the first gate line provided for the pixel unit receives the first gate drive signal having an active level by x*H, that is, writing of a data voltage starts after a reset voltage written to the control electrode of the driving transistor acts on the control electrode of the driving transistor for duration of x*H.

In the related art, the reset voltage is writedn to the control electrode of the driving transistor for a duration of H; apparently, compared with the related art, the technical solution of the present disclosure can effectively prolong the duration for which the reset voltage is written to the driving transistor, so that the difference in the bias effects of the different display brightnesses on the driving transistor can be further improved and even eliminated, thereby effectively improving and even eliminating the residual image.

Figure 5:
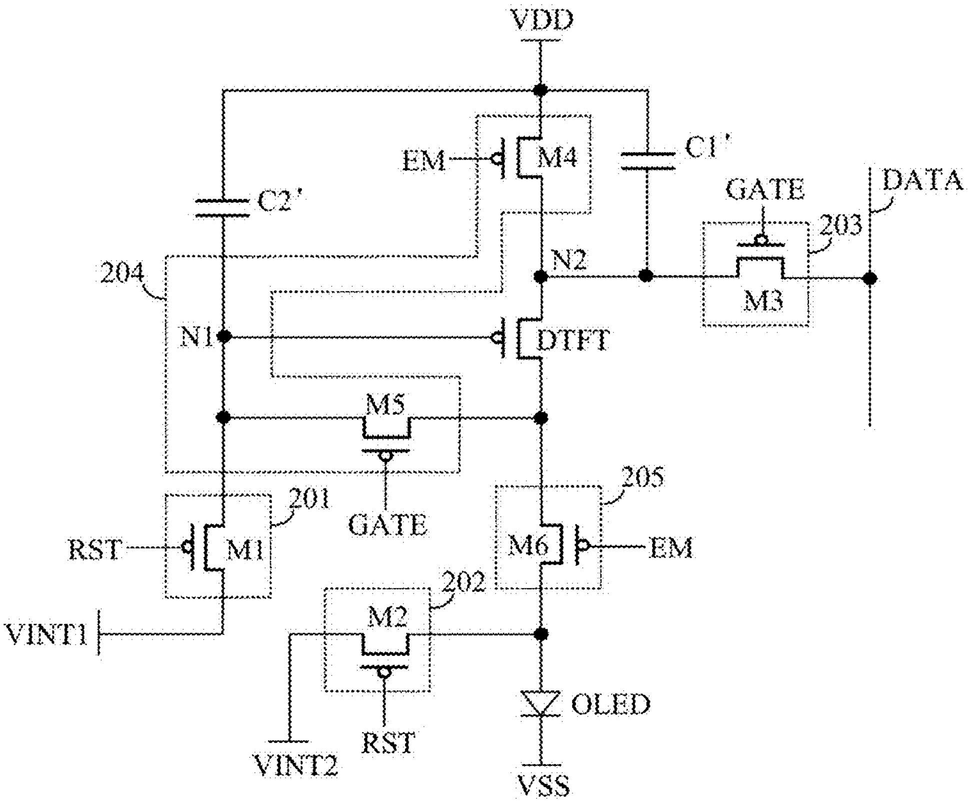
FIG. 5 is a schematic diagram showing a circuit structure of a pixel unit according to an embodiment of the present disclosure.

FIG. 5 is a schematic diagram showing a circuit structure of a pixel unit according to an embodiment of the present disclosure. As shown in FIG. 5, in some embodiments, the pixel unit 2 includes: a pixel circuit and a light emitting device. The pixel circuit drives the light emitting device to emit light under the control of some signal lines configured for the pixel circuit (such as the first gate line, the reset signal line and a light emission control line). The light emitting device in the present disclosure refers to a current-driven light emitting element such as an Organic Light Emitting Diode (OLED) and a Light Emitting Diode (LED). The embodiments of the present disclosure in which the light emitting device is an OLED will be illustrated as an example, with a first terminal and a second terminal of the light emitting device referring to an anode terminal and a cathode terminal respectively.

In some embodiments, the pixel circuit includes: a first reset sub-circuit 201, a second reset sub-circuit 202, a data write sub-circuit 203, a threshold compensation sub-circuit 204, and a driving transistor DTFT.

The first reset sub-circuit 201 is connected to a first reset power terminal, a control electrode of the driving transistor DTFT, and the corresponding reset signal line RST. The first reset sub-circuit 201 is configured to write a first reset voltage provided by the first reset power terminal to a gate electrode of the driving transistor DTFT under the control of the reset signal line RST.

The second reset sub-circuit 202 is connected to the first reset power terminal, a first terminal of the light emitting device OLED, and the corresponding reset signal line RST. The second reset sub-circuit 202 is configured to write a second reset voltage provided by a second reset power terminal to the first terminal of the light emitting device OLED under the control of the reset signal line RST.

The data write sub-circuit 203 is connected to a first electrode of the driving transistor DTFT, a corresponding data line DATA, and the corresponding first gate line GATE. The data write sub-circuit 203 is configured to write a data voltage provided by the data line DATA to the first electrode of the driving transistor DTFT under the control of the first gate line GATE.

The threshold compensation sub-circuit 204 is connected to a second operating power terminal, the control electrode of the driving transistor DTFT, the first electrode of the driving transistor DTFT, a second electrode of the driving transistor DTFT, and the corresponding first gate line GATE. The data write sub-circuit 203 is configured to write a data compensation voltage, which is equal to a sum of the data voltage and a threshold voltage of the driving transistor DTFT, to the control electrode of the driving transistor DTFT under the control of the first gate line GATE.

The second electrode of the driving transistor DTFT is connected to the first terminal of the light emitting device OLED, and the driving transistor DTFT is configured to output a corresponding driving current under the control of the data compensation voltage; and a second terminal of the light emitting device OLED is connected to a first operating power terminal.

Still with reference to FIG. 5, in some embodiments, the first reset sub-circuit 201 includes a first transistor M1, the second reset sub-circuit 202 includes a second transistor M2, the data write sub-circuit 203 includes a third transistor M3, and the threshold compensation sub-circuit 204 includes a fourth transistor M4 and a fifth transistor M5.

A control electrode of the first transistor M1 is connected to the reset signal line RST, a first electrode of the first transistor M1 is connected to the first reset power terminal, and a second electrode of the first transistor M1 is connected to the control electrode of the driving transistor DTFT.

A control electrode of the second transistor M2 is connected to the reset signal line RST, a first electrode of the second transistor M2 is connected to the second reset power terminal, and a second electrode of the second transistor M2 is connected to the first terminal of the light emitting device OLED.

A control electrode of the third transistor M3 is connected to the first gate line GATE, a first electrode of the third transistor M3 is connected to the data line DATA, and a second electrode of the third transistor M3 is connected to the first electrode of the driving transistor DTFT.

A control electrode of the fourth transistor M4 is connected to a light emission control signal line, a first electrode of the fourth transistor M4 is connected to the second operating power terminal, and a second electrode of the fourth transistor M4 is connected to the first electrode of the driving transistor DTFT.

A control electrode of the fifth transistor M5 is connected to the first gate line GATE, a first electrode of the fifth transistor M5 is connected to the control electrode of the driving transistor DTFT, and a second electrode of the fifth transistor M5 is connected to the second electrode of the driving transistor DTFT.

In some embodiments, the pixel circuit further includes: a sixth transistor M6, through which the second electrode of the driving transistor DTFT is connected to the first terminal of the light emitting device OLED; and a control electrode of the sixth transistor M6 is connected to the light emission control signal line, a first electrode of the sixth transistor M6 is connected to the second electrode of the driving transistor DTFT, and a second electrode of the sixth transistor M6 is connected to the first terminal of the light emitting device OLED.

An operation process of the pixel unit shown in FIG. 5 is described in detail below by taking a case where the first transistor M1 to the sixth transistor M6 and the driving transistor DTFT are all P-type transistors as an example. The first reset power terminal provides a first reset voltage VINT1, the second reset power terminal provides a second reset voltage VINT2, the first operating power terminal provides a first operating voltage VSS, and the second operating power terminal provides a second operating voltage VDD. The first gate drive signal is a monopulse signal, and duration when the first gate drive signal has an active level during one period is t, and $H \geq t$.

It is easily envisaged by those skilled in the art without creative work that at least one of the first transistor M1 to the sixth transistor M6 and the driving transistor DTFT is an N-type transistor to implement the following operation process, which belongs to the scope of the embodiments of the present disclosure.

Figure 6:
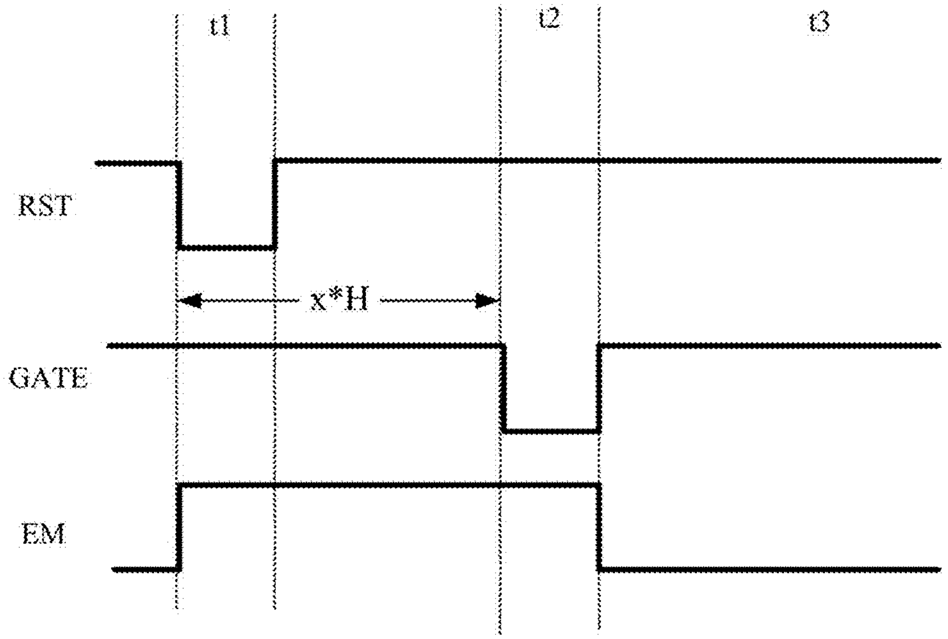
FIG. 6 is an operation sequence diagram of the pixel unit shown in FIG. 5.

FIG. 6 is an operation sequence diagram of the pixel unit shown in FIG. 5. As shown in FIG. 6, an operation process of the pixel circuit includes: a reset phase t1, a data write and compensation phase t2, and a light emission phase t3.

In the reset phase t1, the reset signal line RST provides a low-level signal (i.e., an active level), the first gate line GATE provides a high-level signal (i.e., an inactive level), and a light emission control line EM provides a high-level signal (i.e., an inactive level).

Since the reset signal line RST provides the low-level signal, the first transistor M1 and the second transistor M2 are both turned on, so that the first reset voltage VINT1 is written to a node N1 through the first transistor M1 to reset the control electrode of the driving transistor DTFT; meanwhile, the second reset voltage VINT2 is written to the second electrode of the driving transistor DTFT and the first terminal of the light emitting device OLED through the second transistor M2 to reset the second electrode of the driving transistor DTFT and the first terminal of the light emitting device OLED.

Both the first gate line GATE and the light emission control line EM provide the high-level signals, so that the second transistor M2 to the sixth transistor M6 are all turned off.

After the reset phase lasts for the duration of $x*H$ from the begining of the reset phase, the data write and compensation phase begins, that is, duration of the action of the first reset voltage VINT1 on the control electrode of the driving transistor DTFT is $x*H$.

In the data write and compensation phase t2, the reset signal line RST provides a high-level signal (i.e., an inactive level), the first gate line GATE provides a low-level signal (i.e., an active level), and the light emission control line EM provides a high-level signal (i.e., an inactive level).

Since the reset signal line RST provides a high-level signal, the first transistor M1 and the second transistor M2 are turned off. Meanwhile, since the first gate line GATE provides a low-level signal, the third transistor M3 and the fifth transistor M5 are both turned on, the data voltage provided by the data line DATA is written to a node N2 through the third transistor M3, at this time, the driving transistor DTFT is turned on, and the node N1 is charged through the fifth transistor M5 until a voltage at the node N1 reaches Vdata+Vth and the driving transistor DTFT is turned off, and the charging finishes. Vdata is the data voltage, and Vth is the threshold voltage of the driving transistor DTFT.

It should be noted that the sixth transistor M6 is turned off during the process of charging the node N1 by using the current output from the driving transistor DTFT, so that the light emitting device OLED may be prevented from emitting light by mistake, thereby improving a display effect. Of course, in some embodiments, the sixth transistor M6 may be omitted.

In the light emission phase t3, the reset signal line RST provides a high-level signal (i.e., an inactive level), the gate line GATE provides a high-level signal (i.e., an inactive level), and the light emission control line EM provides a low-level signal (i.e., an active level).

Since the light emission control line EM provides a low-level signal, the fourth transistor M4 and the sixth transistor M6 are turned on, and the driving transistor DTFT outputs a driving current I according to a voltage at the node N1 to drive the light emitting device OLED to emit light. A saturated driving current of the driving transistor DTFT can be obtained by the following formula:

$$\begin{aligned} I &= K*(Vgs - Vth)^2 \\ &= K*(Vdata + Vth - VDD - Vth)^2 \\ &= K*(Vdata - VDD)^2 \end{aligned}$$

where K is a constant (a magnitude of K is related to electrical characteristics of the driving transistor DTFT), and Vgs is a gate-source voltage of the driving transistor DTFT.

It can be seen from the above formula that the driving current of the driving transistor DTFT is only related to the data voltage Vdata and the operating voltage VDD, but is irrelevant to the threshold voltage Vth of the driving transistor DTFT, so that the driving current flowing through the light emitting device OLED can be prevented from being affected by the non-uniformity and drift of the threshold voltage, and thus uniformity of the driving current flowing through the light emitting device OLED can be effectively improved.

In some embodiments, in order to ensure that a voltage at the node N2 is always kept to Vdata during the data write and compensation phase t2, the pixel circuit may further include a first storage capacitor C1', a first electrode of the first storage capacitor C1' is connected to the second operating power terminal, and a second electrode of the first storage capacitor C1' is connected to the first electrode of the driving transistor DTFT.

In some embodiments, in order to ensure that the voltage at the node N1 is always equal to Vdata+Vth during the light emission phase, the pixel circuit may further include a second storage capacitor C2', a first electrode of the second storage capacitor C2' is connected to the second operating power terminal, and a second electrode of the second storage capacitor C2' is connected to the control electrode of the driving transistor DTFT.

Figure 7:
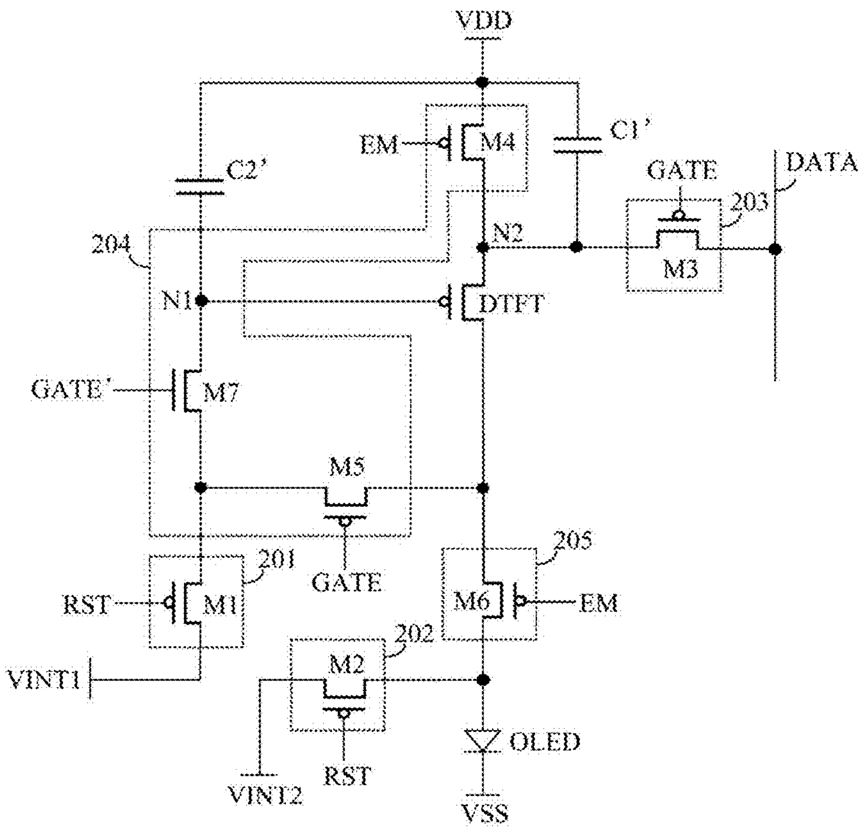
FIG. 7 is a schematic diagram showing another circuit structure of a pixel unit according to an embodiment of the present disclosure.

FIG. 7 is a schematic diagram showing another circuit structure of a pixel unit according to the embodiments of the present disclosure. As shown in FIG. 7, the pixel unit shown in FIG. 7 not only includes the first transistor M1 to the sixth transistor M6 and the driving transistor DTFT as described above, but also includes a seventh transistor M7. The first electrode of the fifth transistor M5 and the second electrode of the first transistor M1 are both connected to the control electrode of the driving transistor DTFT through the seventh transistor M7; and a control electrode of the seventh transistor M7 is connected to a corresponding second gate line GATE', a first electrode of the seventh transistor M7 is connected to the first electrode of the fifth transistor M5 and the second electrode of the first transistor M1, and a second electrode of the seventh transistor M7 is connected to the control electrode of the driving transistor DTFT.

An operation process of the pixel unit shown in FIG. 7 is described in detail below by taking a case where the first transistor M1 to the sixth transistor M6 and the driving transistor DTFT are all P-type transistors and the seventh transistor M7 is an N-type transistor as an example. The N-type transistor may be an oxide transistor, and the P-type transistors may be Low Temperature Poly-Silicon (LTPS) transistors.

Figure 8:
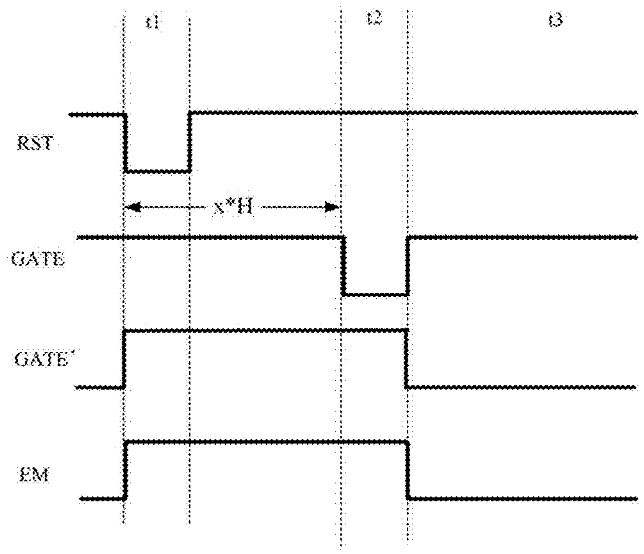
FIG. 8 is an operation sequence diagram of the pixel circuit shown in FIG. 7.
Figure 9:
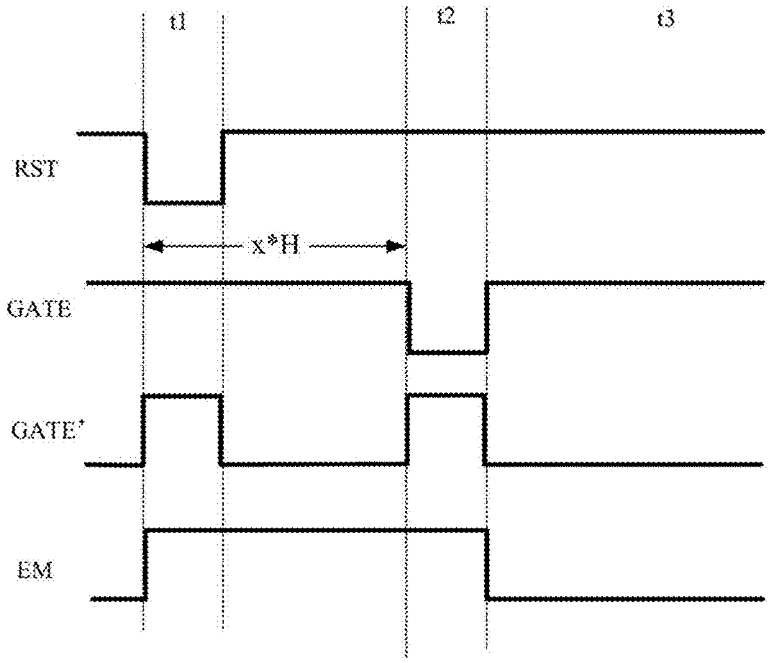
FIG. 9 is another operation sequence diagram of the pixel circuit shown in FIG. 7.

FIG. 8 is a operation sequence diagram of the pixel circuit shown in FIG. 7, and FIG. 9 is another operation sequence diagram of the pixel circuit shown in FIG. 7. As shown in FIG. 8 and FIG. 9, the signals provided by the first gate line GATE, the reset signal line RST and the light emission control line EM may refer to those in FIG. 6, and only a signal provided by the second gate line GATE' is described in detail below.

In the reset phase t1, the second gate line GATE' provides a high-level signal (i.e., an active level), so that the seventh transistor M7 is turned on, so as to ensure that the first reset voltage may be written to the node N1 through the first transistor M1 and the seventh transistor M7.

In the data write and compensation phase t2, the second gate line GATE' provides a high-level signal (i.e., an active level), so that the seventh transistor M7 is turned on, so as to ensure that the current output by the driving transistor DTFT may flow to the node N1 through the fifth transistor M5 and the seventh transistor M7.

In the light emission phase t3, the second gate line GATE' provides a high-level signal (i.e., an inactive level), so that the seventh transistor M7 is turned off, so as to prevent the node N1 from discharging through the first transistor M1, thereby effectively keeping the voltage at the node N1 to Vdata+Vth.

It should be noted that as shown in FIG. 8, the second gate line GATE' provides a monopulse signal, that is, the second gate line GATE' always provides a high-level signal from start time of the reset phase t1 to end time of the data write and compensation phase t2. As shown in FIG. 9, the second gate line GATE' provides a monopulse signal, that is, the second gate line GATE' provides a high-level signal during the reset phase t1 and the data write and compensation phase t2, and the second gate line GATE' provides a low-level signal during at least a part of a time period between the reset phase t1 to the data write and compensation phase t2. As shown in FIG. 9, the second gate line GATE' provides an active-level signal during two time periods (the first reset voltage is writed to the node N1 during one of the two time periods, and the writing of the data voltage and implementation of threshold compensation are performed during the other of the two time periods), and the second gate line GATE' provides an inactive-level signal during a time period, during which the seventh transistor M7 is in an off state, between the two time periods in which the second gate line GATE' provides an active-level signal, so as to prevent the node N1 from discharging through the first transistor M1 in the time period between the reset phase t1 and the data write and compensation phase t2 and keep the voltage at the node N1 to the first reset voltage, thereby facilitating elimination of the difference in the bias effects of different display brightnesses on the driving transistor.

It should be noted that the circuit structure shown in FIG. 5 or the circuit structure shown in FIG. 7 is only an alternative solution of the present disclosure, and the technical solutions of the present disclosure are not limited thereto. In the present disclosure, the pixel unit may also adopt other circuit structures, which will not be listed here one by one.

In some embodiments, each pixel unit group is provided with a corresponding second gate line, and the driver block further includes: a second gate drive circuit including n/a second signal output terminals configured to sequentially output second gate drive signals having an active level, with a being a positive integer, a<n, and n/a being a positive integer; and the second gate line provided for the $i^{th}$ pixel unit group is electrically connected to a $\lceil i/a \rceil^{th}$ second signal output terminal, with $\lceil i/a \rceil$ representing rounding up an operation result of i/a.

In some embodiments, the second gate drive circuit includes: n/a cascaded second shift registers; and a signal output terminal of the second shift register in a $k^{th}$ stage is a $k^{th}$ second signal output terminal, with k being a positive integer and k≤n/a.

In some embodiments, two adjacent first signal output terminals successively start to output the first gate drive signal having an active level at a time interval of H, and two adjacent second signal output terminals successively start to output the second gate drive signal having an active level at a time interval of a*H. The first gate drive signal is the monopulse signal, and the duration when the first gate drive signal has an active level in one period is t, and H≥t.

In some embodiments, in a same frame, a time period during which the second gate drive signal output by the $k^{th}$ second signal output terminal has an active level at least partially overlaps with a time period during which the first gate drive signal output by each of a $(a*k-a+1)^{th}$ first signal output terminal to a $(a*k)^{th}$ first signal output terminal has an active level, and also at least partially overlaps with a time period during which the first gate drive signal output by each of a $(a*k-a+1+x)^{th}$ first signal output terminal to a $(a*k+x)^{th}$ first signal output terminal has an active level.

In some embodiments, in a same frame, a time when the $k^{th}$ second signal output terminal starts to output the second gate drive signal having an active level is prior to a time when the $(a*k-a+1)^{th}$ first signal output terminal starts to output the first gate drive signal in the active level, or is the same as the time when the $(a*k-a+1)^{th}$ first signal output terminal starts to output the first gate drive signal in the active level.

In some embodiments, the second gate drive signal is a monopulse signal during a frame; and duration when the second gate drive signal is in the active level in one period is (x+a)*H.

In some other embodiments, the second gate drive signal is a double-pulse signal during one frame; in one period, the double-pulse signal includes a first part in an active level, a second part in an inactive level and a third part in an active level, and the second part is between the first part and the third part; in a same frame, a time period corresponding to the first part of the second gate drive signal output by the $k^{th}$ second signal output terminal at least partially overlaps with the time period of during which the first gate drive signal output by each of the $(a*k-a+1)^{th}$ first signal output terminal to the $(a*k)^{th}$ first signal output terminal is in an active level; and a time period corresponding to the third part of the second gate drive signal output by the $k^{th}$ second signal output terminal at least partially overlaps with the time period during which the first gate drive signal output by each of the $(a*k-a+1+x)^{th}$ first signal output terminal to the $(a*k+x)^{th}$ first signal output terminal is in an active level. Optionally, duration of each of the first part and the third part is greater than or equal to a*H.

In some embodiments, each of the pixel unit groups is provided with a corresponding light emission control line EM1/ . . . /EMn. The driver block 1 further includes: a light emission control drive circuit 5 including (n/b) third signal output terminals configured to sequentially output light emission control signals in an active level, with b being a positive integer, b<n, and n/b being a positive integer. The light emission control line provided for the $i^{th}$ pixel unit group is electrically connected to a $\lceil i/b \rceil^{th}$ third signal output terminal, with $\lceil i/b \rceil$ representing rounding up an operation result of i/b.

In some embodiments, the light emission control drive circuit includes: n/b cascaded third shift registers; and a signal output terminal of the third shift register in a $p^{th}$ stage is a $p^{th}$ third signal output terminal, with p being a positive integer and p≤n/b.

In some embodiments, two adjacent first signal output terminals successively start to output the first gate drive signals having an active level at a time interval of H, and two adjacent third signal output terminals successively start to output the light emission control signals in an active level at a time interval of b*H; and the first gate drive signal is the monopulse signal, and the duration when the first gate drive signal is in an active level in one period is t, and H≥t.

In some embodiments, in a same frame, a time period during which the light emission control signal output by the $p^{th}$ third signal output terminal is in an inactive level overlaps with an entire time period from a time when a $(b*p-b+1)^{th}$ first signal output terminal starts to output the first gate drive signal in an active level to a time when a $(b*p+x)^{th}$ first signal output terminal stops outputting the first gate drive signal in an active level.

In some embodiments, the light emission control signal is a monopulse signal; and duration when the light emission control signal is in an inactive level in one period is greater than or equal to (x+b)*H.

In order to enable those skilled in the art to better understand circuit structures and operations of the second gate drive circuit and the light emission control drive circuit of the present disclosure, the circuit structures and the operations of the second gate drive circuit and the light emission control drive circuit will be described in detail below in conjunction with specific examples.

Figure 10:
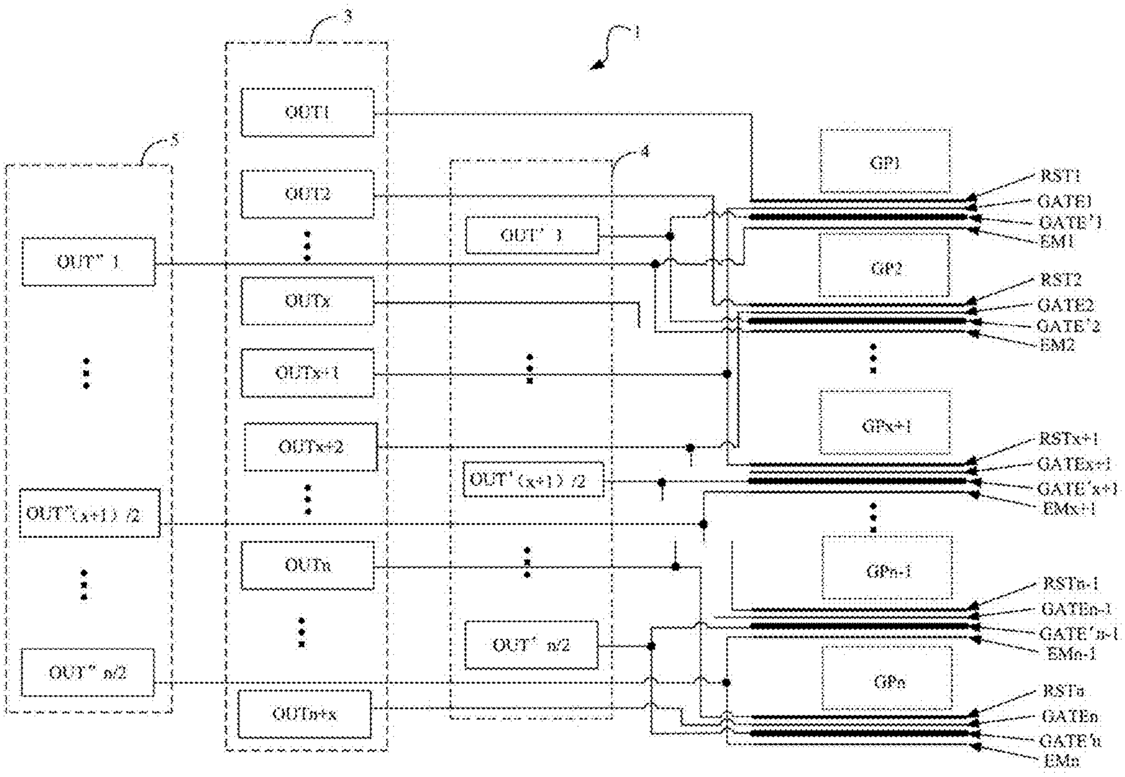
FIG. 10 is a schematic diagram showing a frame structure of a display substrate according to the embodiments of the present disclosure.

FIG. 10 is a schematic diagram showing a frame structure of a display substrate according to an embodiment of the present disclosure. As shown in FIG. 10, in some embodiments, a has a value of 2, and b has a value of 2.

The second gate drive circuit 4 includes n/2 second signal output terminals OUT'1 to OUT'n/2 configured to sequentially output the second gate drive signals in an active level, with n being an even number; and the second gate line GATE'i provided for the $i^{th}$ pixel unit group GPi is electrically connected to the $[i/2]^{th}$ second signal output terminal, with $\lceil i/2 \rceil$ representing rounding up an operation result of i/2. Optionally, the second gate drive circuit includes n/2 cascaded second shift registers; and the signal output terminal of the second shift register in the $k^{th}$ stage is the $k^{th}$ second signal output terminal OUT'k.

The light emission control drive circuit 5 includes n/2 third signal output terminals OUT"1 to OUT"n/2 configured to sequentially output the light emission control signals in an active level, with n being an even number; and the light emission control line EM1 provided for the $i^{th}$ pixel unit group GPi is electrically connected to the $\lceil i/2 \rceil^{th}$ third signal output terminal OUT" $\lceil i/2 \rceil$, with $\lceil i/2 \rceil$ representing rounding up the operation result of i/2. Optionally, the light emission control drive circuit 5 includes n/2 cascaded third shift registers; and the signal output terminal of the third shift register in the $p^{th}$ stage is the $p^{th}$ third signal output terminal OUT"p.

Figure 11:
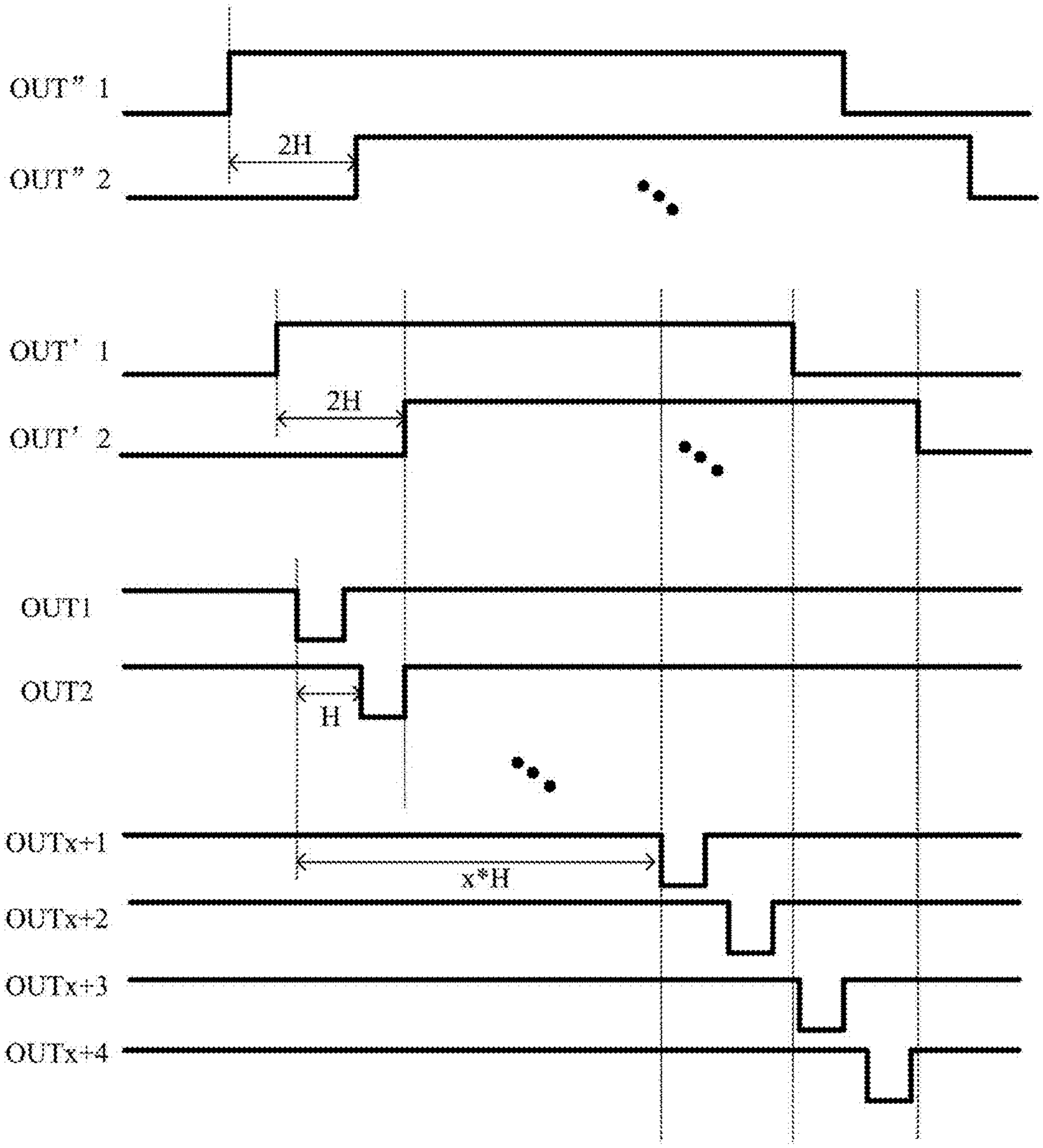
FIG. 11 is an operation sequence diagram of the display substrate shown in FIG. 10.
Figure 12:
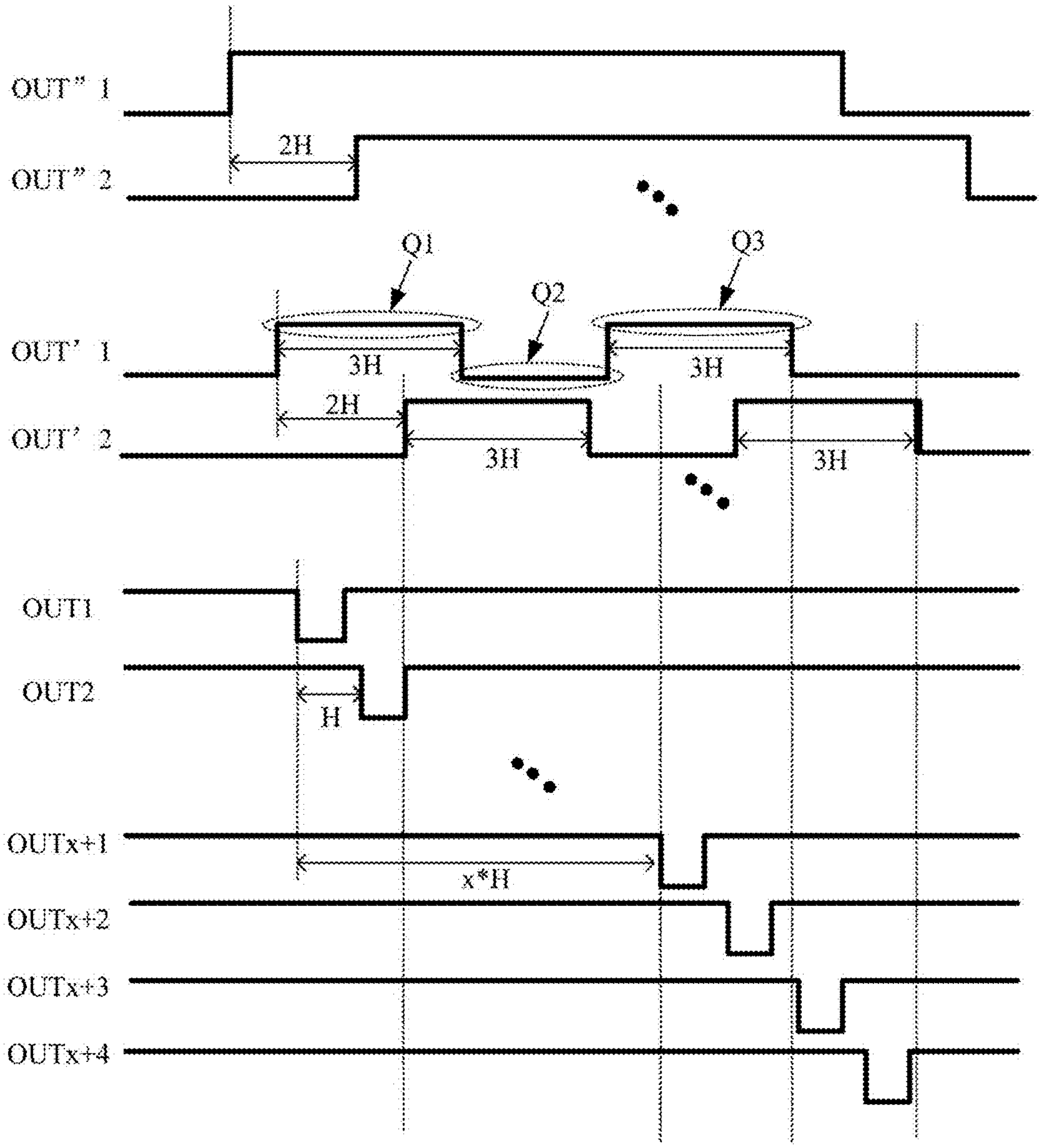
FIG. 12 is another operation sequence diagram of the display substrate shown in FIG. 10.

FIG. 11 is an operation sequence diagram of the display substrate shown in FIG. 10, and FIG. 12 is another operation sequence diagram of the display substrate shown in FIG. 10. As shown in FIG. 11 and FIG. 12, an active level of the first gate drive signal is a low level, and an inactive level of of the first gate drive signal is a high level; an active level of the second gate drive signal is a high level, and an inactive level of the second gate drive signal is a low level; and an active level of the light emission control signal is a low level, and an inactive level of the light emission control signal is a high level.

In some embodiments, two adjacent first signal output terminals (e.g., OUT1 and OUT2) successively start to output the first gate drive signals having an active level (i.e., a low level) at a time interval of H, and two adjacent second signal output terminals (e.g., OUT'1 and OUT'2) successively start to output the second gate drive signals in an active level (i.e., a high level) at a time interval of 2H.

Still with reference to FIG. 11 and FIG. 12, in some embodiments, in a same frame, a time period during which the second gate drive signal output by the $k^{th}$ second signal output terminal OUT'k is in an active level overlaps with an entire time period during which the first gate drive signal output by the $(2k-1)^{th}$ first signal output terminal OUT(2k−1) is in an active level, a time period during which the first gate drive signal output by the $2k^{th}$ first signal output terminal OUT2k is in an active level, a time period during which the first gate drive signal output by the $(2k-1+x)^{th}$ first signal output terminal OUT(2k−1+x) is in an active level, and a time period during which the first gate drive signal output by the $(2k+x)^{th}$ first signal output terminal OUT(2k+x) is in an active level.

In some embodiments, in a same frame, a time when the $k^{th}$ second signal output terminal OUT'k starts to output the second gate drive signal in an active level is prior to a time when the $(2k-1)^{th}$ first signal output terminal OUT(2k−1) starts to output the first gate drive signal in an active level (see FIG. 11 and FIG. 12). In some other embodiments, in a same frame, the time when the $k^{th}$ second signal output terminal OUT'k starts to output the second gate drive signal in an active level is the same as the time when the $(2k-1)^{th}$ first signal output terminal OUT(2k−1) starts to output the first gate drive signal in an active level (this case is not showin in the drawings).

Still with reference to FIG. 11, in some embodiments, the second gate drive signal is a monopulse signal; and, the duration when the second gate drive signal is in an active level in one period is (x+2)*H. It should be noted that the pixel unit may adopt the operation sequence shown in FIG. 8 when the display substrate adopts the operation sequence shown in FIG. 11.

Still with reference to FIG. 12, unlike the second gate drive signal being the monopulse signal as shown in FIG. 11, the second gate drive signal shown in FIG. 12 is a double-pulse signal; in one period, the double-pulse signal includes a first part Q1 in an active level, a second part Q2 in an inactive level, and a third part Q3 in an active level, and the second part Q2 is between the first part Q1 and the third part Q3; in a same frame, a time period corresponding to a first part Q1 of the second gate drive signal output by the $k^{th}$ second signal output terminal OUT'k overlaps with the entire time period during which the first gate drive signal output by the $(2k-1)^{th}$ first signal output terminal OUT(2k−1) is in an active level and the entire time period during which the first gate drive signal output by the $2k^{th}$ first signal output terminal OUT2k is in an active level; and a time period corresponding to a third part Q3 of the second gate drive signal output by the $k^{th}$ second signal output terminal OUT'k overlaps with the entire time period during which the first gate drive signal output by the $(2k-1+x)^{th}$ first signal output terminal OUT(2k−1+x) is in an active level and the entire time period during which the first gate drive signal output by the $(2k+x)^{th}$ first signal output terminal OUT(2k+x) is in an active level. It should be noted that the pixel unit may adopt the operation sequence shown in FIG. 9 when the display substrate adopts the operation sequence shown in FIG. 12.

In some embodiments, duration of each of the first part Q1 and the third part Q3 is greater than or equal to 2H. In an alternative implementation, x>4, and the duration of each of the first part Q1 and the third part Q3 is 3H.

With reference to FIG. 11 and FIG. 12, in some embodiments, two adjacent first signal output terminals (e.g., OUT1 and OUT2) successively start to output the first gate drive signals having an active level (i.e., a low level) at a time interval of H, and two adjacent third signal output terminals (e.g., OUT"1 and OUT"2) successively start to output the light emission control signals in an inactive level (i.e., a high level) at a time interval of 2H.

In some embodiments, in a same frame, a time period during which the light emission control signal output by the $k^{th}$ third signal output terminal OUT"k is in an inactive level (i.e., a high level) overlaps with an entire corresponding time period from the time when the $(2k-1)^{th}$ first signal output terminal OUT(2k−1) starts to output the first gate drive signal in an active level to a time when the $(2k+x)^{th}$ first signal output terminal OUT(2k+x) stops outputting the first gate drive signal in an active level.

Further, in some embodiments, the light emission control signal is a monopulse signal; and duration when the light emission control signal is in an active level in one period is greater than or equal to (x+2)*H.

Figure 13:
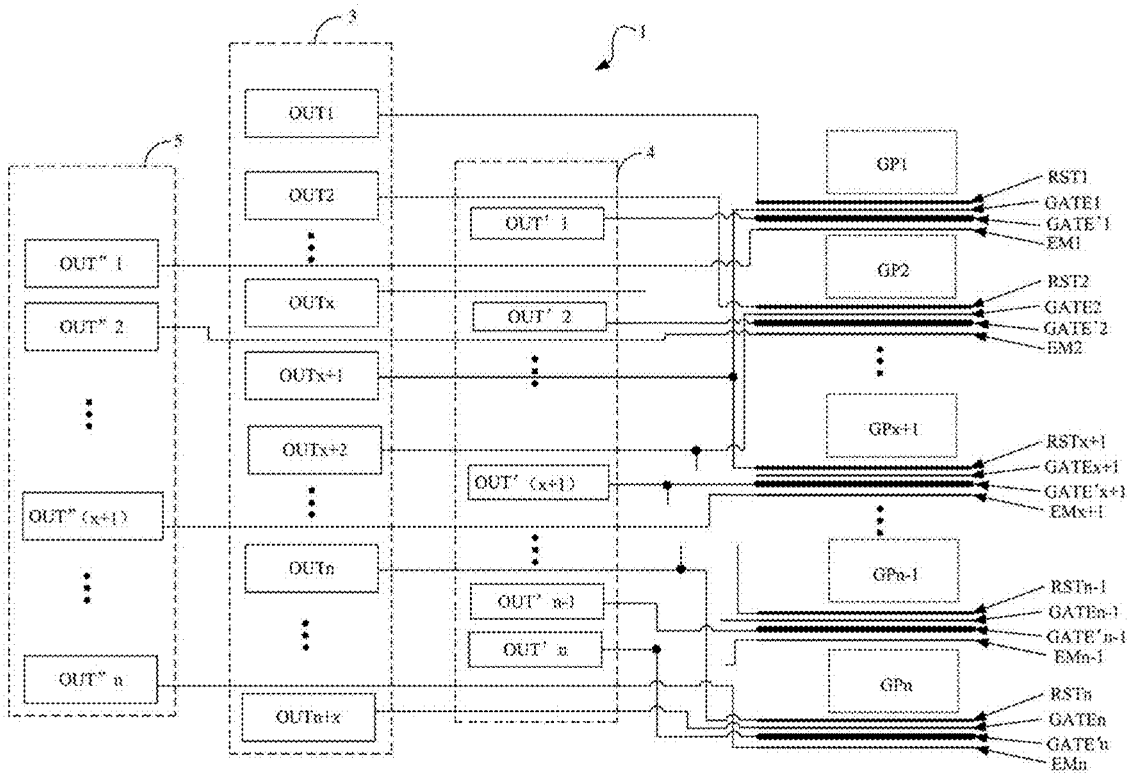
FIG. 13 is a schematic diagram showing a frame structure of a display substrate according to an embodiment of the present disclosure.

FIG. 13 is a schematic diagram of a frame structure of a display substrate according to an embodiment of the present disclosure. As shown in FIG. 13, unlike the embodiment as shown in FIG. 10 where the second gate drive circuit 4 includes n/2 second signal output terminals OUT'1 to OUT'n/2 and the light emission control drive circuit 5 includes n/2 third signal output terminals OUT"1 to OUT"n/2, in the embodiments shown in FIG. 13, the second gate drive circuit 4 includes n second signal output terminals OUT'1 to OUT'n configured to sequentially output the second gate drive signals in an active level, the light emission control drive circuit 5 includes n third signal output terminals OUT"1 to OUT"n configured to sequentially output the light emission control signals in an active level, the second gate line provided for the $i^{th}$ pixel unit group GPi is electrically connected to the $i^{th}$ second signal output terminal OUT'i, and the light emission control line provided for the $i^{th}$ pixel unit group GPi is electrically connected to the $i^{th}$ third signal output terminal OUT"i.

In some embodiments, the second gate drive circuit includes: n cascaded second shift registers, and a signal output terminal of the second shift register in an $i^{th}$ stage is the $i^{th}$ second signal output terminal OUT'i.

Figure 14:
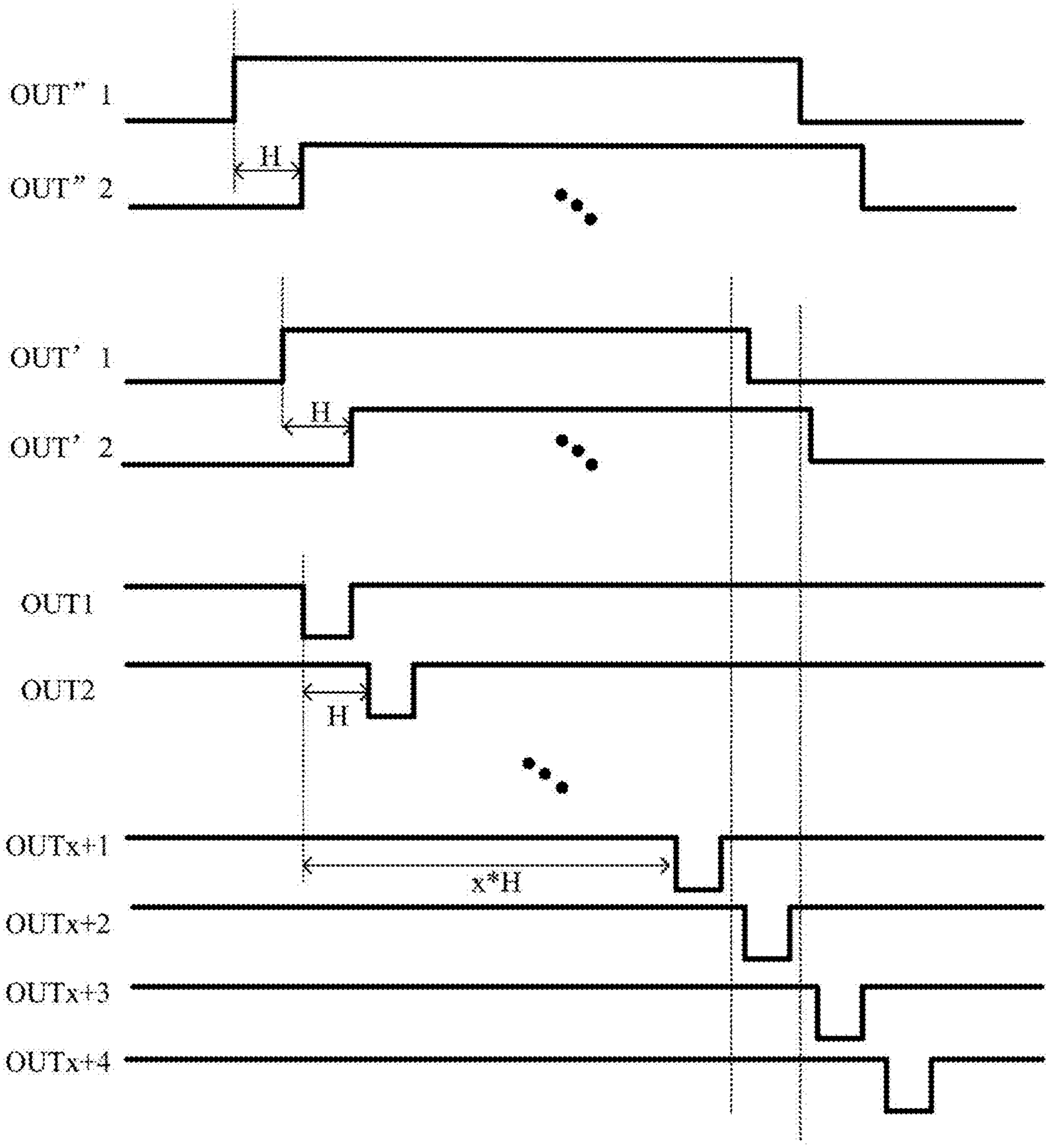
FIG. 14 is an operation sequence diagram of the display substrate shown in FIG. 13.
Figure 15:
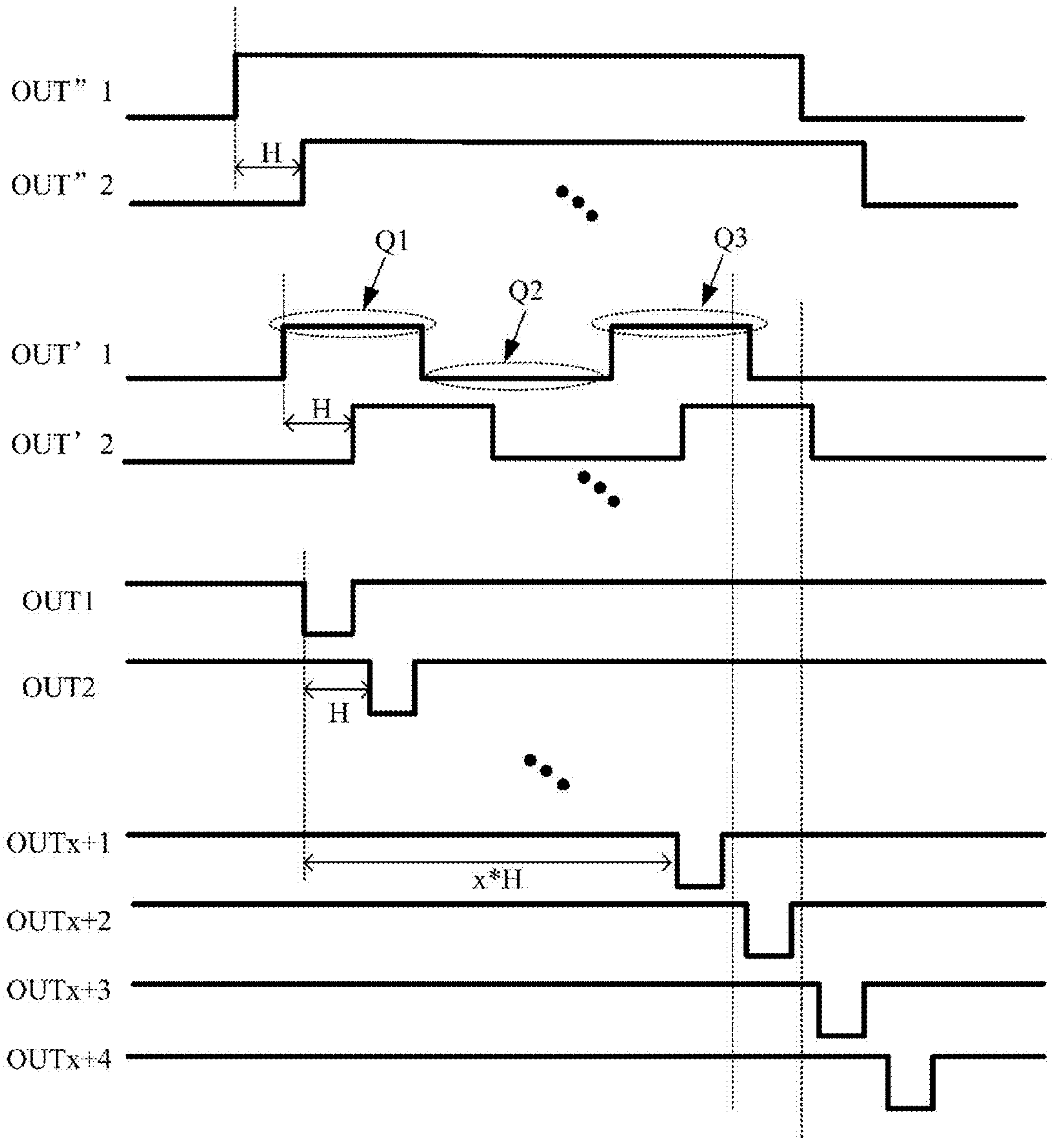
FIG. 15 is another operation sequence diagram of the display substrate shown in FIG. 13.

FIG. 14 is an operation sequence diagram of the display substrate shown in FIG. 13, and FIG. 15 is another operation sequence diagram of the display substrate shown in FIG. 13. As shown in FIG. 14 and FIG. 15, in some embodiments, two adjacent first signal output terminals (e.g., OUT1 and OUT2) start to successively output the first gate drive signals in an active level at a time interval of H, and two adjacent second signal output terminals (e.g., OUT'1 and OUT'2) start to successively output the second gate drive signals in an active level at a time interval of H.

Still with reference to FIG. 14 and FIG. 15, in some embodiments, in a same frame, a time period during which the second gate drive signal output by the $i^{th}$ second signal output terminal OUT'i is in an active level overlaps with an entire time period during which the first gate drive signal output by the $i^{th}$ first signal output terminal OUTi is in an active level, and overlaps with an entire time period during which the first gate drive signal output by the $(i+x)^{th}$ first signal output terminal OUT(i+x) is in an active level.

Still with reference to FIG. 14, in some embodiments, the second gate drive signal is a monopulse signal; and the duration when the second gate drive signal is in an active level in one period is (x+1)*H.

Still with reference to FIG. 15, unlike the embodiment shown in FIG. 14 where the second gate drive signal is the monopulse signal, the second gate drive signal shown in FIG. 14 is a double-pulse signal; in one period, the double-pulse signal includes a first part Q1 in an active level, a second part Q2 in an inactive level, and a third part Q3 in an active level, and the second part Q2 is between the first part Q1 and the third part Q3; in a same frame, a time period corresponding to a first part Q1 of the second gate drive signal output by the $i^{th}$ second signal output terminal OUT'i overlaps with an entire time period during which the first gate drive signal output by the $i^{th}$ first signal output terminal OUTi is in an active level; and a time period corresponding to a third part Q3 of the second gate drive signal output by the $i^{th}$ second signal output terminal OUT'i overlaps with an entire time period during which the first gate drive signal output by the $(i+x)^{th}$ first signal output terminal OUT(i+x) is in an active level.

In some embodiments, duration of each of the first part Q1 and the third part Q3 is greater than or equal to H.

Still with reference to FIG. 13, in some embodiments, the light emission control drive circuit includes: n cascaded third shift registers, and a signal output terminal of the third shift register in an $i^{th}$ stage is the $i^{th}$ third signal output terminal OUT"i.

With reference to FIG. 14 and FIG. 15, in some embodiments, the interval between a time when one of two adjacent first signal output terminals (e.g., OUT1 and OUT2) starts to output the first gate drive signal in the active level state and a time when the other one of the two adjacent first signal output terminals successively starts to output the first gate drive signal in the active level state is H, and the interval between a time when one of two adjacent third signal output terminals (e.g., OUT"1 and OUT"2) starts to output the light emission control signal in an active level and a time when the other one of the two adjacent third signal output terminals successively starts to output the light emission control signal in an active level is H.

In some embodiments, in a same frame, a time period during which the light emission control signal output by the $i^{th}$ third signal output terminal OUT"i is in an inactive level overlaps with the entire time period from a time when the $i^{th}$ first signal output terminal OUTi starts to output the first gate drive signal in an active level to a time when the $(i+x)^{th}$ first signal output terminal OUT(i+x) stops outputting the first gate drive signal in an active level.

Further, in some embodiments, the light emission control signal is a monopulse signal; and the duration when the light emission control signal is in an active level in one period is greater than or equal to (x+1)*H.

It should be noted that, FIG. 10 shows that one second shift register/one third shift register corresponds to two or more pixel unit groups (that is, the value a or b is greater than 1), so that the number of the shift registers in the second gate drive circuit 4/the light emission control drive circuit 5 can be effectively reduced, which is beneficial to reduction of a space occupied by the second gate drive circuit 4/the light emission control drive circuit 5.

FIG. 13 shows that one second shift register/one third shift register corresponds to one pixel unit group (that is, the value of each of a and b is 1), a load for the shift register in each stage in the second gate drive circuit 4/the light emission control drive circuit 5 can be effectively reduced, so as to improve a loading speed and stability of the signal.

It should be noted that, in some other embodiments, the second gate drive circuit 4 adopts the structure shown in FIG. 10 (i.e., the second gate drive circuit 4 includes n/2 second signal output terminals), and the light emission control drive circuit adopts the structure shown in FIG. 13 (i.e., the light emission control drive circuit includes n third signal output terminals); in some other embodiments, the second gate drive circuit 4 adopts the structure shown in FIG. 13 (i.e., the second gate drive circuit 4 includes n second signal output terminals), and the light emission control drive circuit adopts the structure shown in FIG. 10 (i.e., the light emission control drive circuit includes n/2 third signal output terminals). Although no drawings corresponding to the above two cases are given, the above two cases still belong to the scope of the present disclosure. Certainly, the values of a and b are not limited to 1 or 2, and may be designed according to actual needs as long as the values of a and b are positive integers.

Figure 16:
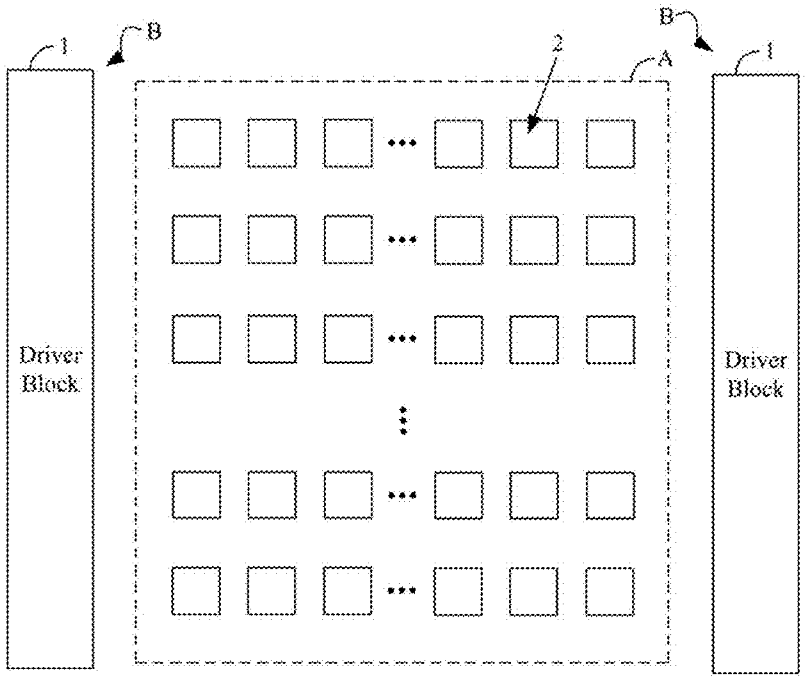
FIG. 16 is another schematic diagram showing a structure of a display substrate according to an embodiment of the present disclosure.

FIG. 16 is another schematic diagram showing a structure of a display substrate according to an embodiment of the present disclosure. As shown in FIG. 16, in some embodiments, the display substrate includes two driver blocks respectively located on opposite sides of the active region. With the two driver blocks, double-side driving (or driving from two sides) of the signal lines in the active region can be realized, thereby facilitating an improvement in the loading speed of the signals.

Figure 17:
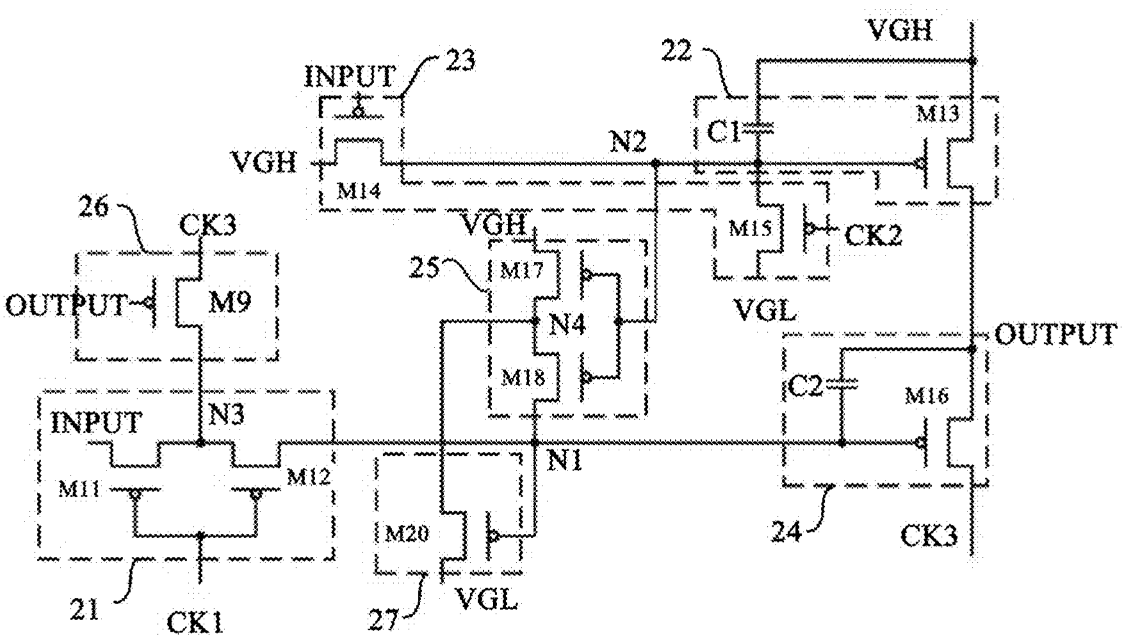
FIG. 17 is a schematic diagram showing a circuit structure of a first shift register according to an embodiment of the present disclosure.
Figure 18:
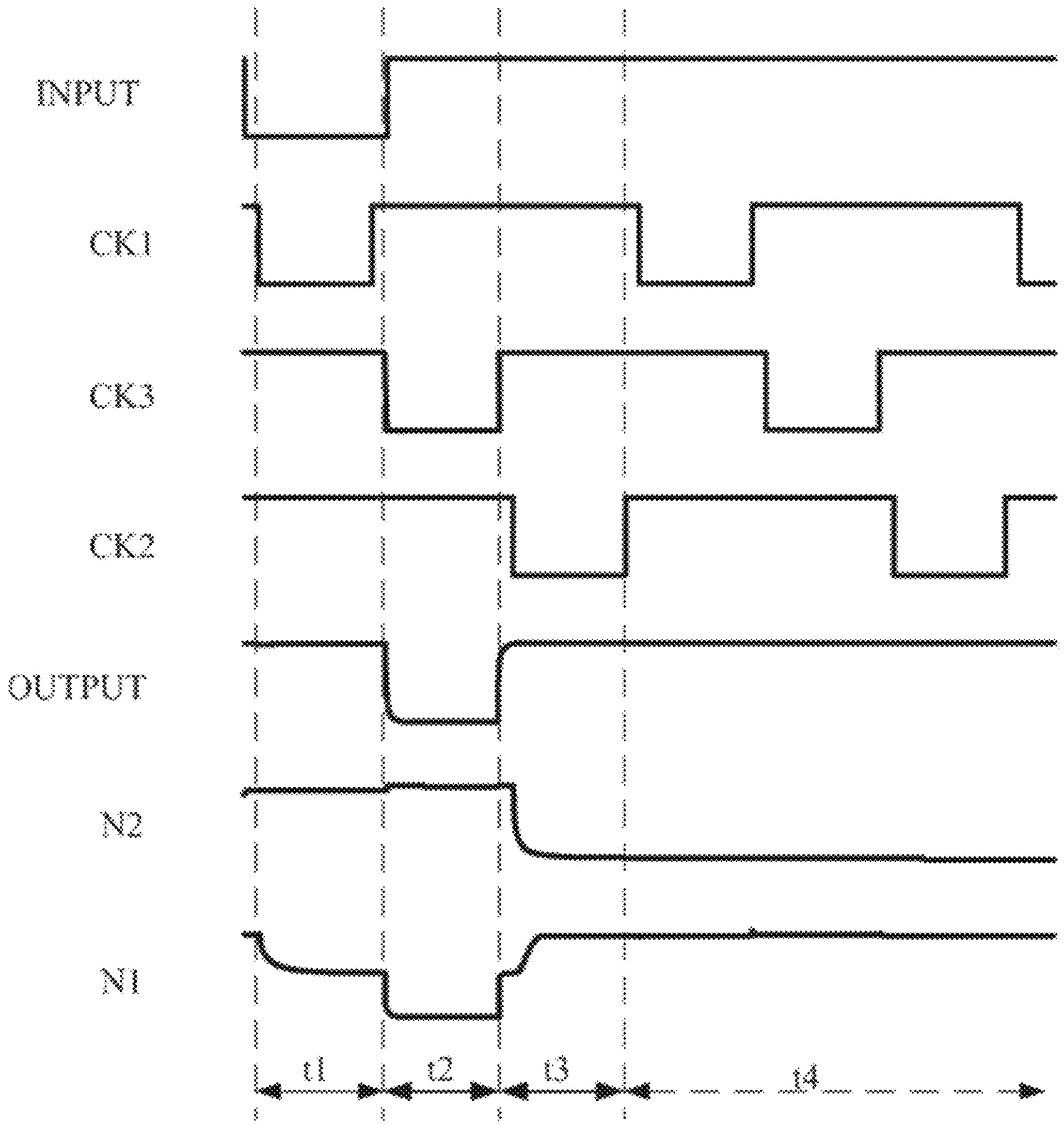
FIG. 18 is an operation sequence diagram of the first shift register shown in FIG. 17.

FIG. 17 is a schematic diagram of a circuit structure of a first shift register according to an embodiment of the present disclosure. FIG. 18 is an operation sequence diagram of the first shift register shown in FIG. 17. As shown in FIG. 17 and FIG. 18, in some embodiments, the first shift register includes: an input unit 21, a pull-up unit 22, a pull-up control unit 23, a pull-down unit 24, a pull-down control unit 25, a first noise reduction unit 26, and a second noise reduction unit 27.

A first terminal of the input unit 21 is connected to an input terminal INPUT of the first shift register for receiving an input signal from the input terminal INPUT, a second terminal of the input unit 21 is connected to a first clock signal terminal CK1, and a third terminal of the input unit 21 is connected to a first node N1. The input unit 21 is configured to transfer the received input signal to the first node N1 under the control of a first clock signal from the first clock signal terminal CK1.

A first terminal of the pull-up unit 22 is connected to a first power voltage terminal VGH, a second terminal of the pull-up unit 22 is connected to a second node N2, and a third terminal of the pull-up unit 22 is connected to an output terminal OUTPUT of the first shift register. The pull-up unit 22 is configured to apply a voltage VGH from the first power voltage terminal to the output terminal OUTPUT under the control of a voltage at the second node N2.

A first terminal of the pull-up control unit 23 is connected to a second clock signal terminal CK2, a second terminal of the pull-up control unit 23 is connected to the first power voltage terminal VGH, a third terminal of the pull-up control unit 23 is connected to the second node N2, a fourth terminal of the pull-up control unit 23 is connected to the input terminal INPUT, and a fifth terminal of the pull-up control unit 23 is connected to a second power voltage terminal VGL. The pull-up control unit 23 is configured to apply the voltage from the first power voltage terminal VGH to the second node N2 under the control of the input signal or apply a voltage from the second power voltage terminal VGL to the second node N2 under the control of a second clock signal from the second clock signal terminal.

A first terminal of the pull-down unit 24 is connected to the first node N1, a second terminal of the pull-down unit 24 is connected to a third clock signal terminal CK3, and a third terminal of the pull-down unit 24 is connected to the output terminal OUTPUT. The pull-down unit 24 is configured to supply a third clock signal from the third clock signal terminal CK3 to the output terminal OUTPUT under the control of the voltage at the first node N1.

A first terminal of the pull-down control unit 25 is connected to the first power voltage terminal VGH, a second terminal of the pull-down control unit 25 is connected to the first node N1, and a third terminal of the pull-down control unit 25 is connected to the second node N2. The pull-down control unit 25 is configured to apply the voltage from the first power voltage terminal VGH to the first node N1 under the control of the voltage at the second node N2.

A first terminal of the first noise reduction unit 26 is connected to the third clock signal terminal CK3, a second terminal of the first noise reduction unit 26 is connected to the output terminal OUTPUT, and a third terminal of the first noise reduction unit 26 is connected to a third node N3. The first noise reduction unit 26 is configured to reduce current leakage from the input unit 21 to the first node N1 by adjusting a voltage at the third node N3.

A first terminal of the second noise reduction unit 27 is connected to a fourth node N4, a second terminal of the second noise reduction unit 27 is connected to the first node N1, and a third terminal of the second noise reduction unit 27 is connected to the second power voltage terminal VGL. The second noise reduction unit 27 is configured to reduce current leakage from the pull-down control unit 25 to the first node N1 by adjusting a voltage of the fourth node N4.

The third node N3 is a junction of the first noise reduction unit 26 and the input unit 21, and the fourth node N4 is a junction of the second noise reduction unit 27 and the pull-down control unit 25.

The first noise reduction unit 26 and the second noise reduction unit 27 maintain a level of the first node N1 by reducing the current leakage from both of the input unit 21 and the pull-down control unit 25 to the first node N1, thereby reducing noise of the output terminal of the first shift register.

In some embodiments, each of the first clock signal from the first clock signal terminal, the second clock signal from the second clock signal terminal, and the third clock signal from the third clock signal terminal has a duty ratio of 33%, respectively.

In an embodiment, the input unit 21 includes an eleventh transistor M11 and a twelfth transistor M12. A gate electrode of the eleventh transistor M11 is connected to the first clock signal terminal CK1, a first electrode of the eleventh transistor M11 is connected to the input terminal INPUT, and a second electrode of the eleventh transistor M11 is connected to the third node N3. A gate electrode of the twelfth transistor M12 is connected to the first clock signal terminal CK1, a first electrode of the twelfth transistor M12 is connected to the third node N3, and a second electrode of the twelfth transistor M12 is connected to the first node N1. When the first clock signal from the first clock signal terminal CK1 is at a low level, both of the eleventh transistor M11 and the twelfth transistor M12 are respectively turned on, so as to transfer the input signal from the input terminal INPUT to the first node N1.

In an embodiment, for example, the pull-up unit 22 includes a thirteenth transistor M13 and a first capacitor C1. A gate electrode of the thirteenth transistor M13 is connected to the second node N2, a first electrode of the thirteenth transistor M13 is connected to the first power voltage terminal VGH, and a second electrode of the thirteenth transistor M13 is connected to the output terminal OUTPUT. A first terminal of the first capacitor C1 is connected to the second node N2, and a second terminal of the first capacitor C1 is connected to the first power voltage terminal VGH. When the voltage at the second node N2 is at a low level, the thirteenth transistor M13 is turned on, so as to apply the voltage VGH from the first power voltage terminal to the output terminal OUTPUT.

In an embodiment, for example, the pull-up control unit 23 includes a fourteenth transistor M14 and a fifteenth transistor M15. A gate electrode of the fourteenth transistor M14 is connected to the input terminal INPUT, a first electrode of the fourteenth transistor M14 is connected to the first power voltage terminal VGH, and a second electrode of the fourteenth transistor M14 is connected to the second node N2. A gate electrode of the fifteenth transistor M15 is connected to the second clock signal terminal CK2, a first electrode of the fifteenth transistor M15 is connected to the second node N2, and a second electrode of the fifteenth transistor M15 is connected to the second power voltage terminal VGL. For example, when the second clock signal from the second clock signal terminal CK2 is at a low level, the fifteenth transistor M15 is turned on, so as to apply the voltage from the second power voltage terminal VGL to the second node N2; and when the input signal from the input terminal INPUT is at a low level, the fourteenth transistor M14 is turned on, so as to apply the voltage from the first power voltage terminal VGH to the second node N2.

In an embodiment, for example, the pull-down unit 24 includes a sixteenth transistor M16 and a second capacitor C2. A gate electrode of the sixteenth transistor M16 is connected to the first node N1, a first electrode of the sixteenth transistor M16 is connected to the output terminal OUTPUT, and a second electrode of the sixteenth transistor M16 is connected to the third clock signal terminal CK3. A first terminal of the second capacitor C2 is connected to the first node N1, and a second terminal of the second capacitor C2 is connected to the output terminal OUTPUT. When the voltage at the first node N1 is at a low level, the sixteenth transistor M16 is turned on, so as to supply the third clock signal from the third clock signal terminal CK3 to the output terminal OUTPUT.

In an embodiment, for example, the pull-down control unit 25 includes a seventeenth transistor M17 and an eighteenth transistor M18. A gate electrode of the seventeenth transistor M17 is connected to the second node N2, a first electrode of the seventeenth transistor M17 is connected to the first power voltage terminal VGH, and a second electrode of the seventeenth transistor M17 is connected to the fourth node N4. A gate electrode of the eighteenth transistor M18 is connected to the second node N2, a first terminal of the eighteenth transistor M18 is connected to the fourth node N4, and a second terminal of the eighteenth transistor M18 is connected to the first node N1. When the voltage at the second node N2 is at a low level, both of the seventeenth transistor M17 and the eighteenth transistor M18 are respectively turned on, so as to apply the voltage from the first power voltage terminal VGH to the first node N1.

In an embodiment, for example, the first noise reduction unit 26 includes a nineteenth transistor M19, a gate electrode of the nineteenth transistor M19 is connected to the output terminal OUTPUT, a first electrode of the nineteenth transistor M19 is connected to the third clock signal terminal CK3, and a second electrode of the nineteenth transistor M19 is connected to the third node N3. When an output signal from the output terminal OUTPUT and the third clock signal from the third clock signal terminal CK3 are both at a low level, the nineteenth transistor M19 is turned on to pull down the voltage at the third node N3, so as to reduce current leakage from the twelfth transistor M12 to the first node N1, thereby reducing an influence on the voltage level at the first node N1, that is, an influence on a voltage level of the gate electrode of the driving transistor, i.e., the sixteenth transistor M16, can be reduced, the noise at the output terminal of the first shift register can be reduced, and driving capability of the driving transistor can be improved.

In an embodiment, for example, the second noise reduction unit 27 includes a twentieth transistor M20, a gate electrode of the twentieth transistor M20 is connected to the first node N1, a first electrode of the twentieth transistor M20 is connected to the fourth node N4, and a second electrode of the twentieth transistor M20 is connected to the second power voltage terminal VGL. When the voltage at the first node N1 is at a low level, the twentieth transistor M20 is turned on to pull down a voltage at the fourth node N4, so that current leakage from the eighteenth transistor M18 to the first node N1 can be reduced, and an influence on the voltage level at the first node N1 can be reduced, so that the voltage level at the first node N1 can be kept to a relatively low level all the time, that is, the influence on the voltage level at the gate electrode of the driving transistor, i.e., the sixteenth transistor M16, can be reduced, the noise at the output terminal can be reduced, and the driving capability of the driving transistor can be improved.

An operation process of the first shift register shown in FIG. 17 is described in detail below by taking an embodiment in which the first power voltage terminal provides a high-level voltage VGH, and the second power terminal provides a low-level voltage VGL, and each of the transistors is a P-type transistor as an example.

In a first phase t1 (i.e., an input phase), a signal input to the input terminal INPUT and the first clock signal of the first clock signal terminal CK1 have a low level VL (which also represents a voltage level of the second power voltage terminal VGL in the present embodiment), and the third clock signal of the third clock signal terminal CK3 has a high level VH (which also represents a voltage level of the first power voltage terminal VGH in the present embodiment). The eleventh transistor M11 and the twelfth transistor M12 are turned on to transfer the low-level signal from the input terminal INPUT to the first node N1, so that at this time, the first node N1 is at a low level. Since a P-type transistor has a threshold loss when the P-type transistor transfers a low level, the level at the first node N1 is VL+|vthp|, where vthp represents a threshold voltage of the transistors (it is assumed in the present embodiment that all the transistors have the same threshold voltage). Since the first node N1 is at the low level, the driving transistor, i.e., the sixteenth transistor M16, is turned on. Since the third clock signal from the third clock signal terminal CK3 is at the high level VH, the output terminal OUTPUT outputs a high-level output signal. Meanwhile, since the input signal of the input terminal INPUT is at the low level, the fourteenth transistor M14 is turned on to pull a level at the second node N2 to the high level of the first power voltage terminal VGH, and the thirteenth transistor M13 is turned off.

In a second phase t2 (i.e., a pull-down phase), the input signal of the input terminal INPUT and the first clock signal of the first clock signal terminal CK1 are at the high level VH, and the third clock signal of the third clock signal terminal CK3 is at the low level VL. Since the sixteenth transistor M16 is turned on in the phase t1, the third clock signal from the third clock signal terminal CK3 is at a low level, and thus the output terminal OUTPUT outputs a low-level output signal. Since the first clock signal from the first clock signal terminal CK1 is at a high level, the eleventh transistor M11 and the twelfth transistor M12 are turned off. The level of the second node N2 is pulled to the high level during the phase t1, so that the seventeenth transistor M17 and the eighteenth transistor M18 are turned off, and the gate electrode of the sixteenth transistor M16 is floating. Since a capacitor has a property of keeping a voltage difference across two terminals thereof unchanged, a voltage difference (VL+|Vthp|−VH) across the two terminals of the second capacitor C2 is kept unchanged, and thus the voltage level at the first node N1 decreases with a decrease of a voltage level of the output terminal OUTPUT, and is finally maintained at 2VL+|Vthp|−VH. The sixteenth transistor M16 operates in a linear region, and the third clock signal from the third clock signal terminal CK3 is transferred to the output terminal OUTPUT without a threshold loss, and the voltage level of the output signal from the output terminal OUTPUT is VL. In such process, the nineteenth transistor M19 is turned on under the control of the low-level output signal from the output terminal OUTPUT, a voltage level of the third node N3 is pulled down, and a leakage current of the twelfth transistor M12 can be reduced, so that the influence on the voltage level at the first node N1 can be reduced, that is, the influence on the voltage level of the gate electrode of the driving transistor (i.e., the sixteenth transistor M16) can be reduced, and the noise of the output terminal of the first shift register can be reduced. Meanwhile, the voltage level at the first node N1 is low, so that the twentieth transistor M20 is turned on, and thus a voltage level at the fourth node N4 is pulled down, so that a leakage current of the eighteenth transistor M18 can be reduced, and thus the influence on the voltage level at the first node N1 can be reduced, so that the voltage level at the first node N1 may be kept low all the time, that is, the influence on the voltage level of the gate electrode of the driving transistor (i.e., the sixteenth transistor M16) can be reduced, the noise of the output terminal can be reduced, and the driving capability of the driving transistor can be improved.

A third phase t3 (i.e., a pull-up phase) includes two sub-phases. In a first one of the sub-phases, since the third clock signal from the third clock signal terminal CK3 jumps to the high level VH and the second capacitor C2 has the property of keeping the voltage difference across the two terminals thereof unchanged, the voltage level at the first node N1 also jumps to VL+|Vthp|. The sixteenth transistor M16 is still in an turned-on state, and the output signal from the output terminal OUTPUT is pulled up to the high level VH of the third clock signal from the third clock signal terminal CK3. In the second one of the sub-phases, the second clock signal from the second clock signal terminal CK2 jumps to a low level, the fifteenth transistor M15 is turned on, the level of the second node N2 is pulled down, and the thirteenth transistor M13 is turned on, and the output signal from the output terminal OUTPUT is kept at the high level VH. Meanwhile, the seventeenth transistor M17 and the eighteenth transistor M18 are turned on to pull the first node N1 to the high level VH, and the sixteenth transistor M16 is turned off.

In a fourth phase t4 (i.e., a holding phase), the second clock signal from the second clock signal terminal CK2 periodically jumps to a low level to keep the second node N2 to a low-level voltage, so that the thirteenth transistor M13 is turned on to keep the output signal of the output terminal OUTPUT to the high level VH. The seventeenth transistor M17 and the eighteenth transistor M18 are turned on under the control of the low level of the second node N2, so as to keep the first node N1 to the high level VH. The first clock signal from the first clock signal terminal CK1 periodically jumps to a low level, so that the eleventh transistor M11 and the twelfth transistor M12 are turned on, so as to keep the first node N1 to the high level VH. Thus, stable outputting of the output terminal OUTPUT can be ensured, and noise can be reduced.

It should be noted that the circuit structure of the first shift register in the first gate drive circuit 3 in the embodiments of the present disclosure is not limited to thoses shown in FIG. 17, and the first shift register may also adopt other circuit structures, which will not be described herein.

Figure 19:
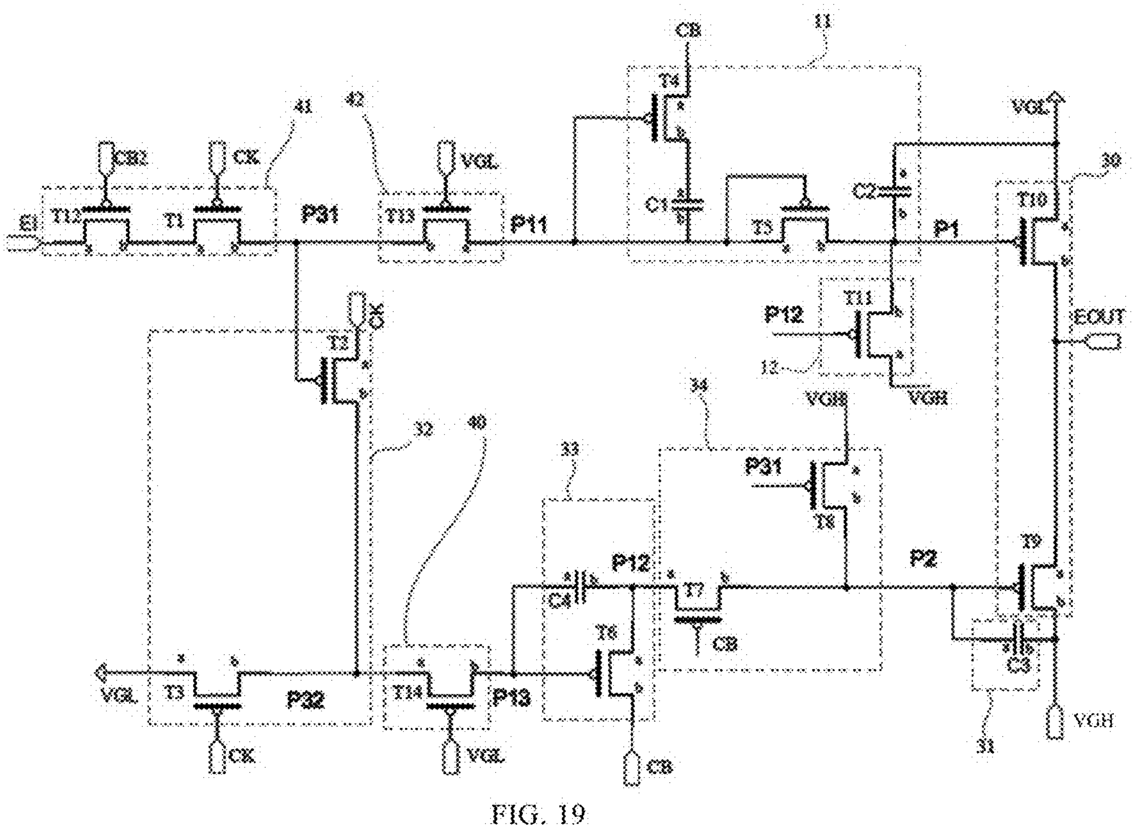
FIG. 19 is a schematic diagram showing a circuit structure of a second shift register according to an embodiment of the present disclosure.
Figure 20:
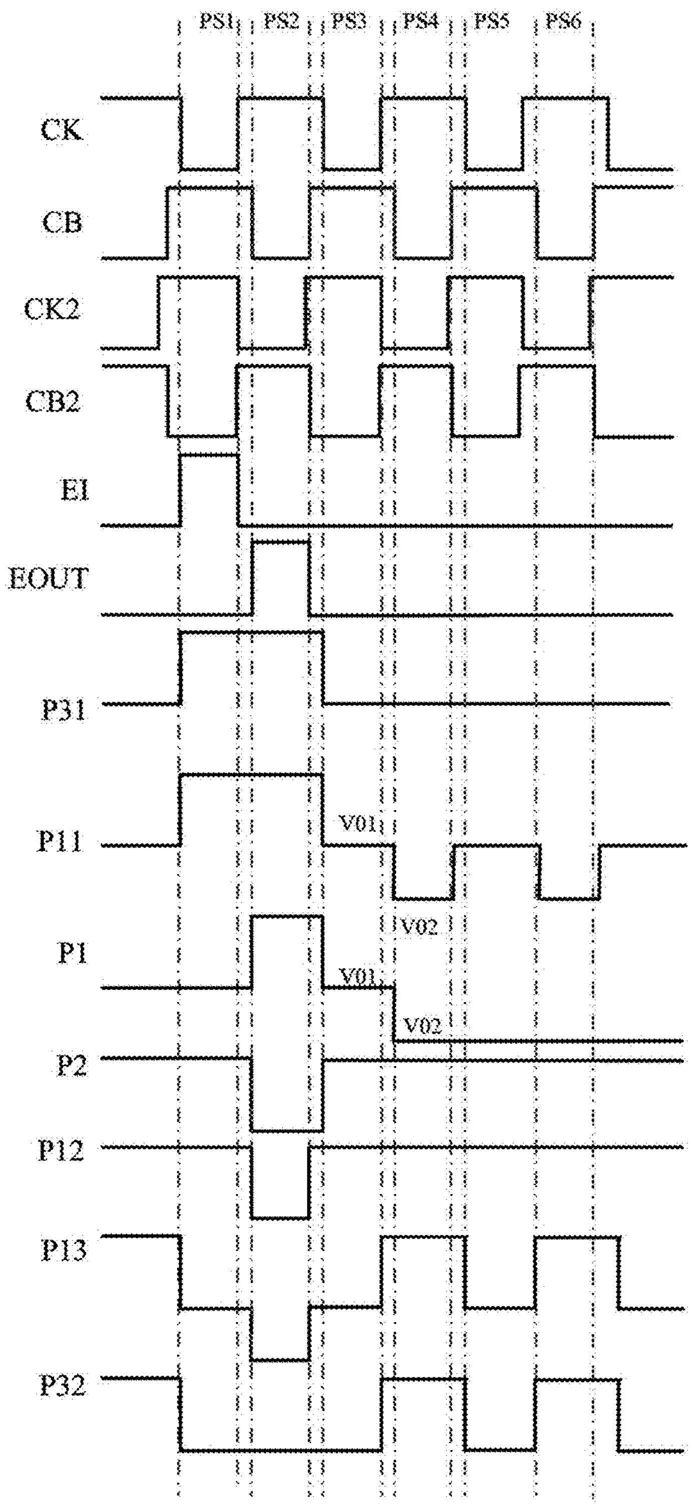
FIG. 20 is an operation sequence diagram of the second shift register shown in FIG. 19; and and FIG. 21 is a schematic diagram showing another circuit structure of a second shift register according to an embodiment of the present disclosure.

FIG. 19 is a schematic diagram showing a circuit structure of a second shift register according to an embodiment of the present disclosure, and FIG. 20 is an operation sequence diagram of the second shift register shown in FIG. 19. As shown in FIG. 19 and FIG. 20, in some embodiments, the second shift register includes fourteen transistors T1 to T14, and four capacitors (i.e., a first capacitor C1, a second capacitor C2, a third capacitor C3, and a fourth capacitor C4). FIG. 19 shows that each of the transistors has a first electrode a and a second electrode b, and each of the capacitors has a first electrode a and a second electrode b.

When a plurality of second shift registers are cascaded, a first electrode of the transistor T12 in the second shift register at a first stage is connected to an input terminal EI which is configured to be connected to a trigger signal line to receive a trigger signal as an input signal, and a first electrode of the transistor T12 in the second shift register in a corresponding stage of the other stages is electrically connected to an output terminal EOUT of the second shift register in the previous stage immediately before the corresponding stage, so as to receive an output signal output from the output terminal EOUT of the second shift register in the previous stage as an input signal, thereby realizing shift output to provide the pixel units arranged in the array in the active region with, for example, the second gate drive signals that shift row by row.

In addition, as shown in FIG. 19, the second shift register further includes a first clock signal terminal CB and a second clock signal terminal CB2. For example, the first clock signal terminal CB is connected to a first clock signal line or a second clock signal line to receive a first clock signal. For example, when the first clock signal terminal CB is connected to the first clock signal line, the first clock signal line provides the first clock signal; when the first clock signal terminal CB is connected with the second clock signal line, the second clock signal line provides the first clock signal; and which clock signal line providing the first clock signal depends on actual conditions, and is not limited in the embodiments of the present disclosure. Similarly, the second clock signal terminal CB2 is connected to the second clock signal line or the first clock signal line to receive a second clock signal. In the following description, an embodiment in which the first clock terminal CB is connected to the first clock signal line to receive the first clock signal and the second clock terminal CB2 is connected to the second clock signal line to receive the second clock signal is taken as an example, and the embodiments of the present disclosure are not limited thereto. For example, the first clock signal and the second clock signal may be pulse signals having duty ratios greater than 50%, and may differ by a half cycle, for example.

In addition, as shown in FIG. 19, the second shift register further includes a third clock signal terminal CK and a fourth clock signal terminal CK2 (not shown in FIG. 19). For example, in the second shift register in a next stage immediately after the second shift register shown in FIG. 19, the third clock signal terminal CK shown in FIG. 19 may be replaced with the fourth clock signal terminal CK2. For example, the third clock signal terminal CK is connected to a third clock signal line or a fourth clock signal line to receive a third clock signal. For example, when the third clock signal terminal CK is connected to the third clock signal line, the third clock signal line provides the third clock signal; when the third clock signal terminal CK is connected to the fourth clock signal line, the fourth clock signal line provides the third clock signal; and which clock signal line providing the third clock signal depends on actual conditions, and is not limited in the embodiments of the present disclosure. Similarly, the fourth clock signal terminal CK2 is connected to the third clock signal line or the fourth clock signal line to receive a fourth clock signal. In the following description, an embodiment in which the third clock terminal CK is connected to the third clock signal line to receive the third clock signal and the fourth clock terminal CK2 is connected to the fourth clock signal line to receive the fourth clock signal is taken as an example, and the embodiments of the present disclosure are not limited thereto. For example, the third clock signal and the fourth clock signal may be pulse signals having duty ratios greater than 50%, and may differ by a half cycle, for example.

VGL represents a first power line and a first power voltage provided by the first power line, VGH represents a second power line and a second power voltage provided by the second power line, and the first power voltage is higher than the second power voltage. For example, the first power voltage is a direct-current high level, and the second power voltage is a direct-current low level. For example, P31, P11, P1, P2, P12, P13, and P32 denote a first isolation node, a first input node, a first node, a second node, a second input node, a third input node, and a second isolation node respectively in a circuit diagram. That is, FIG. 19 shows the first isolation node P31, the first input node P11, the first node P1, the second node P2, the second input node P12, the third input node P13, and the second isolation node P32. As shown in FIG. 19, the second shift register includes a charge pump circuit 11, a first isolation node control sub-circuit 41, a first isolation sub-circuit 42, a first energy storage circuit 31, a first node control circuit 12, a second isolation node control sub-circuit 32, a second isolation sub-circuit 40, a second input node control sub-circuit 33, a second node control sub-circuit 34, and an output circuit 30.

As shown in FIG. 19, the charge pump circuit 11 includes the first clock signal terminal CB, the first capacitor C1, the transistor T5, and the second capacitor C2. A first electrode of the first capacitor C1 is connected to the first clock signal terminal CB, and a second electrode of the first capacitor C1 is connected to the first input node P11. A first electrode of the transistor T5 is connected to the first input node P11, and a second electrode of the transistor T5 is connected to the first node P1. A gate electrode of the transistor T5 is connected to the first electrode or the second electrode of the transistor T5, so as to form a diode-connected transistor. A first electrode of the second capacitor C2 is connected to the first power line VGL, and a second electrode of the second capacitor C2 is connected to the first node P1.

As shown in FIG. 19, the charge pump circuit 11 further includes the transistor T4. A gate electrode of the transistor T4 is electrically connected to the first input node P11, a first electrode of the transistor T4 is electrically connected to the first clock signal terminal CB, and a second electrode of the transistor T4 is electrically connected to the first electrode of the first capacitor C1.

It should be noted that the charge pump circuit 11 may not include the transistor T4; and in a case where the charge pump circuit 11 does not include the transistor T4, the first clock signal terminal CB is connected to the first electrode of the first capacitor C1.

As shown in FIG. 19, the output circuit 30 is respectively connected to the first node P1, the second node P2, the first power line VGL, the second clock signal terminal CB2, and the output terminal EOUT, and the output circuit 30 is configured to output, under the control of a potential of the first node P1, the first power voltage to the output terminal EOUT for reset, and to output, under the control of a potential of the second node P2, the second clock signal to the output terminal EOUT for outputting of the second gate drive signal in an active level.

As shown in FIG. 19, the output circuit 30 includes the transistor T10 and the transistor T9. A gate electrode of the transistor T10 is electrically connected to the first node P1, a first electrode of the transistor T10 is electrically connected to the first power line VGL, and a second electrode of the transistor T10 is electrically connected to a drive signal output terminal EOUT. A gate electrode of the transistor T9 is electrically connected to the second node P2, a first electrode of the transistor T9 is electrically connected to the drive signal output terminal EOUT, and a second electrode of the transistor T9 is electrically connected to the second clock signal terminal CB2. On the one hand, a reset speed of the output terminal EOUT is increased with the addition of the second clock signal terminal CB2. On the other hand, connecting the second electrode of the transistor T9 to the second clock signal terminal CB2 facilitates increasing a charging/discharging speed of the output terminal EOUT.

In some embodiments, when the transistor is a P-type transistor, a first voltage signal may be a low-level signal, and the charge pump circuit 11 may further pull down the potential of the first node P1; when a first output transistor is an N-type transistor, the first voltage signal may be a high-level signal, and the charge pump circuit 11 may further increase the potential of the first node P1; but the embodiments of the present disclosure are not limited thereto. As shown in FIG. 20, an operation process of the second shift register includes six phases, i.e., a first phase PS1, a second phase PS2, a third phase PS3, a fourth phase PS4, a fifth phase PS5 and a sixth phase PS6, respectively. The first phase PS1 is an input phase, the second phase PS2 is an output phase, the third phase PS3 is a reset phase, the fourth phase PS4 is a first holding period, the fifth phase PS5 is a second holding period, and the sixth phase PS6 is a third holding period. That is, the fourth phase PS4, the fifth phase PS5, and the sixth phase PS6 constitute a holding phase. In the embodiments of the present disclosure, an operating cycle of the second shift register may include the input phase, the output phase, the reset phase and the holding phase which are sequentially arranged; the input terminal provides the input signal in the input phase; the second shift register outputs the second gate drive signal in an active level in the output phase; the drive signal is reset in the reset phase, so that the second shift register outputs the second gate drive signal in an inactive level; and the second shift register keeps outputting the second gate drive signal in an inactive level in the holding phase.

For example, a drive signal output from the second shift register is output to the gate electrode of the transistor of the pixel circuit, and in a case where the transistor which receives the drive signal output from the second shift register is an N-type transistor, an active level of the second gate drive signal is a high level, and an inactive level of the second gate drive signal is a low level. In a case where the transistor which receives the drive signal output from the second shift register is a P-type transistor, an active level of the second gate drive signal is a low level, and an inactive level of the second gate drive signal is a high level.

In some embodiments, the first energy storage circuit 31 is respectively connected to the second node P2 and the second clock signal terminal CB2, and the first energy storage circuit 31 is configured to control the potential of the second node P2. For example, the first energy storage circuit 31 is configured to maintain the potential of the second node P2 in the holding phase. For example, in some embodiments, the first energy storage circuit 31 includes the third capacitor C3, a first electrode of the third capacitor C3 is electrically connected to the second node P2, and a second electrode of the third capacitor C3 is connected to the second clock signal terminal CB2.

In some embodiments, the first isolation node control sub-circuit 41 is electrically connected to the second clock signal terminal CB2, the third clock signal terminal CK, the input terminal EI, and the first isolation node P31 respectively, and the first isolation node control sub-circuit 41 is configured to transmit the input signal from the input terminal EI to the first isolation node P31 under the control of the second clock signal and the third clock signal.

In some embodiments, the first isolation node control sub-circuit 41 includes the transistor T12 and the transistor T1; a gate electrode of the transistor T12 is electrically connected to the second clock signal terminal CB2, and a first electrode of the transistor T12 is electrically connected to the input terminal EI; a gate electrode of the transistor T1 is electrically connected to the third clock signal terminal CK, a first electrode of the transistor T1 is electrically connected to a second electrode of the transistor T12, and a second electrode of the transistor T1 is electrically connected to the first isolation node P31. For example, when the second shift register is a second shift register in a first stage, the input terminal EI of the second shift register is connected to the trigger signal line to receive the trigger signal; when the second shift register is any one of the other stages except the first stage, the input terminal EI of the second shift register is connected to the output terminal EOUT of the second shift register in a previous stage. In some other embodiments, the first isolation node control sub-circuit 41 may include the transistor T12 only or include the transistor T1 only. For example, the arrangement of the transistor T12 and the transistor T1 may facilitate reducing the current leakage.

In some embodiments, the first isolation sub-circuit 42 is electrically connected to the first power line VGL, the first isolation node P31, and the first input node P11 respectively, and the first isolation sub-circuit 42 is configured to control the connection between the first isolation node P31 and the first input node P11. For example, with the first isolation sub-circuit 42, current leakage from the first input node P11 to the first isolation node P31 can be reduced, that is, a potential at the first isolation node P31 may be maintained when a potential at the first input node P11 changes, thereby improving a response speed of outputting of the drive signal. In some embodiments, the first isolation sub-circuit 42 includes the transistor T13. A gate electrode of the transistor T13 is electrically connected to the first power line VGL, a first electrode of the transistor T13 is electrically connected to the first input node P11, and a second electrode of the transistor T13 is electrically connected to the first isolation node P31. For example, with the transistor T13, the current leakage from the first input node P11 to the first isolation node P31 can be reduced, so that the response speed of the outputting of the drive signal is higher. For example, in some other embodiments, the second shift register may not include the first isolation sub-circuit 42, that is, the transistor T13 may be omitted, in this case the first isolation node P31 and the first input node P11 are a same node.

In some embodiments, the second node control sub-circuit 34 is electrically connected to the first clock signal terminal CB, the second input node P12, the second node P2, the first isolation node P31, and the second power line VGH respectively, and the second node control sub-circuit 34 is configured to electrically connect or disconnect the second input node P12 to or from the second node P2 under the control of the first clock signal, and is further configured to write the second power voltage to the second node P2 under the control of the potential of the first isolation node P31, so as to control the potential of the second node P2.

In some embodiments, the second node control sub-circuit 34 includes the transistor T7 and the transistor T8. A gate electrode of the transistor T7 is electrically connected to the first clock signal terminal CB, a first electrode of the transistor T7 is electrically connected to the second input node P12, and a second electrode of the transistor T7 is electrically connected to the second node P2. A gate electrode of the transistor T8 is electrically connected to the first isolation node P31, a first electrode of the transistor T8 is electrically connected to the second power line VGH, and a second electrode of the transistor T8 is electrically connected to the second node P2. For example, the transistor T7 may prevent current leakage to the second input node P12, avoid an influence of the fourth capacitor C4 on the second node P2, and enhance a coupling effect of the second clock signal provided by the second clock signal terminal CB2 on the second node P2, so that the potential of the second node P2 may become lower when a potential of the second clock signal decreases, thereby increasing a discharging speed of the transistor T9 to the output terminal EOUT.

In some embodiments, the second input node control sub-circuit 33 is electrically connected to the third input node P13, the second input node P12, and the first clock signal terminal CB respectively, and the second input node control sub-circuit 33 is configured to write the first clock signal to the second input node P12 under the control of a potential of the third input node P13, and is further configured to control a potential at the second input node P12 under the contro of the potential of the third input node P13. In some embodiments, the second input node control sub-circuit 33 includes the transistor T6 and the fourth capacitor C4. A gate electrode of the transistor T6 is electrically connected to the third input node P13, a first electrode of the transistor T6 is electrically connected to the second input node P12, and a second electrode of the transistor T6 is electrically connected to the first clock signal terminal CB. A first electrode of the fourth capacitor C4 is electrically connected to the third input node P13, and a second electrode of the fourth capacitor C4 is electrically connected to the second input node P12.

In some embodiments, the second isolation node control sub-circuit 32 is respectively connected to the first isolation node P31, the second isolation node P32, the third clock signal terminal CK, and the first power line VGL, and the second isolation node control sub-circuit 32 is configured to input the first power voltage or the third clock signal to the second isolation node P32 under the control of both of the potential of the first isolation node P31 and the third clock signal, so as to control a potential of the second isolation node P32.

For example, in some embodiments, the second isolation node control sub-circuit 32 includes the transistor T3 and the transistor T2. A gate electrode of the transistor T3 is electrically connected to the third clock signal terminal CK, a first electrode of the transistor T3 is electrically connected to the first power line VGL, and a second electrode of the transistor T3 is electrically connected to the second isolation node P32. A gate electrode of the transistor T2 is electrically connected to the first isolation node P31, a first electrode of the transistor T2 is electrically connected to the third clock signal terminal CK, and a second electrode of the transistor T2 is electrically connected to the second isolation node P32.

In some embodiments, the second isolation sub-circuit 40 is respectively connected to the second isolation node P32, the third input node P13, and the first power line VGL, and the second isolation sub-circuit 40 is configured to control the connection or disconnection between the second isolation node P32 and the third input node P13. With the second isolation sub-circuit 40, current leakage from the third input node P13 to the second isolation node P32 can be prevented, and an influence of the fourth capacitor C4 on the second isolation node P32 can be avoided.

In some embodiments, the second isolation sub-circuit 40 includes the transistor T14. A gate electrode of the transistor T14 is electrically connected to the first power line VGL, a first electrode of the transistor T14 is electrically connected to the second isolation node P32, and a second electrode of the transistor T14 is electrically connected to the third input node P13. With the transistor T14, the current leakage from the third input node P13 to the second isolation node P32 can be prevented, so that the response speed of the outputting of the drive signal is higher. In some other embodiments, the second shift register may not include the second isolation sub-circuit 40, that is, the transistor T14 can be omitted, in this case the second isolation node P32 and the third input node P13 are a same node.

In some embodiments, the first node control circuit 12 is electrically connected to the second input node P12, the second power line VGH, and the first node P1 respectively, and the first node control circuit 12 is configured to write the second power voltage to the first node P1 under the control of the potential of the second input node P12, so as to control the potential of the first node P1. For example, in some embodiments, the first node control circuit 12 includes the transistor T11. A gate electrode of the transistor T11 is electrically connected to the second input node P12, a first electrode of the transistor T11 is electrically connected to the second power line VGH, and a second electrode of the transistor T11 is electrically connected to the first node P1.

As an example, all the transistors in the second shift register shown in FIG. 19 are the P-type transistors, that is, each transistor is turned on when the gate electrode thereof receives a low-level signal and is turned off when the gate electrode thereof receive a high-level signal. For example, the first electrode of the transistor may be a source electrode, and the second electrode of the transistor may be a drain electrode.

The second shift register may have a structure as shown in FIG. 19, but is not limited thereto, for example, the transistors in the second shift register may all be N-type transistors or may be P-type transistors together with N-type transistors, as long as all the terminals of the selected type of the transistors are connected according to polarities of the terminals in a way the same as that of the corresponding transistors in the embodiments of the present disclosure.

FIG. 20 is a signal timing diagram and a potential waveform of the nodes in an operation process of the second shift register shown in FIG. 19. The operation process of the second shift register is described in detail below with reference to FIG. 19 and FIG. 20. As shown in FIG. 20, the operation process of the second shift register includes six phases, which are a first phase PS1, a second phase PS2, a third phase PS3, a fourth phase PS4, a fifth phase PS5 and a sixth phase PS6 respectively. FIG. 20 shows timing waveforms of the signals during the phases. The first phase PS1 is an input phase, the second phase PS2 is an output phase, the third phase PS3 is a reset phase, the fourth phase PS4 is a first holding period, the fifth phase PS5 is a second holding period, and the sixth phase PS6 is a third holding period. That is, the fourth phase PS4, the fifth phase PS5 and the sixth phase PS6 constitute the holding phase.

In the first phase PS1, the third clock signal terminal CK provides a low-level signal, the first clock signal terminal CB provides a high-level signal, the second clock signal terminal CB2 provides a low-level signal, the input terminal EI provides a high-level signal. The transistor T12 and the transistor T1 are turned on, the transistor T13 is turned on, the potential of the first input node P11 is at a high level, the potential of the first isolation node P31 is at a high level, and the transistor T5 and the transistor T4 are both turned off; the transistor T2 is turned off, the transistor T3 is turned on, the transistor T14 is turned on, the potential of the second isolation node P32 is at a low level, the potential of the third input node P13 is at a low level, the transistor T6 is turned on, the potential of the second input node P12 is at a high level, the transistor T7 is turned off, the transistor T8 is turned off, the transistor T11 is turned off, the potential of the first node P1 is maintained at a low level, the potential of the second node P2 is maintained at a high level, the transistor T10 is turned on, the transistor T9 is turned off, and the output terminal EOUT outputs a low-level signal.

In the second phase PS2, the third clock signal terminal CK provides a high-level signal, the first clock signal terminal CB provides a low-level signal, the second clock signal terminal CB2 provides a high-level signal, the input terminal EI provides a low-level signal. The transistor T12 and the transistor T1 are both turned off, the potential of the first input node P11 is maintained at a high level due to a storage effect of the first capacitor C1, the transistor T13 is turned on, and the potential of the first isolation node P31 is at a high level; the transistor T4 is turned off, the transistor T5 is turned off, the transistor T2 is turned off, the transistor T3 is turned off, the potential of the second isolation node P32 is maintained at a low level, the transistor T14 is turned off, the potential of the third input node P13 is further pulled down by the fourth capacitor C4, the transistor T6 is turned on, the potential of the second input node P12 is at a low level, the transistor T7 is turned on, the transistor T8 is turned off, the transistor T11 is turned on, the potential of the first node P1 is at a high level, the potential of the second node P2 is at a low level, the transistor T9 is turned on, the transistor T10 is turned off, and the output terminal EOUT outputs a high-level signal.

In the third phase PS3, the third clock signal terminal CK provides a low-level signal, the first clock signal terminal CB provides a high-level signal, the second clock signal terminal CB2 provides a low-level signal, the input terminal EI provides a low-level signal. The transistor T12 and the transistor T1 are both turned on, the potential of the first input node P11 is pulled down, the transistor T13 is turned on, the potential of the first isolation node P31 is pulled down, the transistor T2 is turned on, the transistor T4 is turned on, the transistor T5 is turned on, and the potential of the first node P1 is pulled down; the transistor T10 is turned on; the transistor T3 is turned on, the potential of the second isolation node P32 is at a low level, the transistor T14 is turned on, the transistor T6 is turned on, the potential of the third input node P13 and the potential of the second input node P12 are both pulled up, the transistor T7 is turned off, and the transistor T11 is turned off, and the transistor T8 is turned on, the potential of the second node P2 is at a high level, the transistor T9 is turned off, and the output terminal EOUT outputs a low-level signal.

In the fourth phase PS4, the third clock signal terminal CK provides a high-level signal, the first clock signal terminal CB provides a low-level signal, the second clock signal terminal CB2 provides a high-level signal, the input terminal EI provides a low-level signal, the transistor T12 and the transistor T1 are both turned off, the transistor T4 is turned on, the first clock signal terminal CB pulls down the potential of the first input node P11 through the first capacitor C1, the transistor T13 is turned off, the potential of the first isolation node P31 is maintained at a low level, and the transistor T5 is turned on, so that the potential of the first node P1 is pulled down and kept to be lower than VSS+Vth, with Vth being a threshold voltage of the transistor T10, and the transistor T10 is turned on, thereby keeping a potential of the drive signal output from the output terminal EOUT to VSS and protecting the potential of the drive signal output from the output terminal EOUT against noise interference; and the transistor T3 is turned off, the transistor T2 is turned on, the potential of the second isolation node P32 is at a high level, the transistor T14 is turned on, the potential of the third input node P13 is at a high level, the transistor T6 is turned off, the potential of the second input node P12 is at a high level, the transistor T7 is turned on, the transistor T8 is turned on, the potential of the second node P2 is at a high level, and the transistor T9 is turned off.

In the fifth phase PS5, the third clock signal terminal CK provides a low-level signal, the first clock signal terminal CB provides a high-level signal, the second clock signal terminal CB2 provides a low-level signal, the input terminal EI provides a low-level signal. The transistor T12 and the transistor T1 are both turned on, the potential of the first input node P11 is at a low level, the transistor T13 is turned on, the transistor T4 is turned on, the potential of the first clock signal provided by the first clock signal terminal CB is increased to pull up the potential of the first input node P11 through the first capacitor C1, the transistor T5 is turned off without affecting the potential of the first node P1, and the potential of the first node P1 is kept to be lower than VSS+Vth, under the action of the second capacitor C2, with Vth being the threshold voltage of the transistor T10, and the transistor T10 is turned on, so as to keep the potential of the drive signal output from the output terminal EOUT to VSS and protect the potential of the drive signal output from the output terminal EOUT against noise interference; and the transistor T3 is turned on, the transistor T2 is turned on, the potential of the second isolation node P32 is at a low level, the transistor T14 is turned on, the potential of the third input node P13 is at a low level, the transistor T6 is turned on, the potential of the second input node P12 is at a high level, the transistor T11 is turned off, the transistor T7 is turned off, the transistor T8 is turned on, the potential of the second node P2 is at a high level, and the transistor T9 is turned off.

In the sixth phase PS6, as shown in FIG. 20, the third clock signal terminal CK provides a high-level signal, the first clock signal terminal CB provides a low-level signal, the second clock signal terminal CB2 provides a high-level signal, the input terminal EI provides a low-level signal. The transistor T12 and the transistor T1 are both turned off, the potential of the first input node P11 is maintained at a low level, the transistor T4 is turned on, the first clock signal terminal CB pulls down the potential of the first input node P11 through the first capacitor C1, and the transistor T5 is turned on, so that the potential of the first node P1 is kept to be lower than VSS+Vth, with Vth being the threshold voltage of the transistor T10, and the transistor T10 is turned on, thereby keeping the potential of the drive signal output from the output terminal EOUT to VSS and protecting the potential of the drive signal output from the output terminal EOUT against noise interference; and the transistor T13 is turned off, the potential of the first isolation node P31 is maintained at a low level, the transistor T3 is turned off, the transistor T2 is turned on, the potential of the second isolation node P32 is at a high level, the transistor T14 is turned on, the potential of the third input node P13 is at a high level, the transistor T6 is turned off, the potential of the second input node P12 is at a high level, the transistor T11 is turned off, the transistor T7 is turned on, the transistor T8 is turned on, the potential of the second node P2 is at a high level, and the transistor T9 is turned off.

In the holding phase, the potential of the first node P1 may be kept to be lower than VSS+Vth, with Vth being the threshold voltage of the transistor T10, so that the transistor T10 is turned on, thereby keeping the potential of the drive signal output from the output terminal EOUT to VSS and protecting the potential of the drive signal output from the output terminal EOUT against noise interference.

For example, in a holding phase of outputting of a GOA drive signal, the first input node P11 is at the low level VSS, the transistor T1 and the transistor T12 are configured to initialize the potential of the first input node P11 to VSS, the first capacitor C1 and the transistor T4 are configured to further pull down the potential of the first input node P11 at a falling edge of the first clock signal, and the low level is stored in the first node P1 through the transistor T5 having a diode structure, and at the same time, charges are stored in the second capacitor C2 to maintain the potential. When the first clock signal jumps to a high level, the first input node P11 is pushed up, and the transistor T5 is turned off, without affecting the potential of the first node P1; and when the third clock signal terminal CK and the second clock signal terminal CB2 are at a low level, extra charges are discharged to the first isolation node P31 through the transistor T1 and the transistor T12. The above process is then carried out cyclically.

FIG. 20 shows a first voltage signal V01 and a second voltage signal V02. In some embodiments, the first voltage signal V01 and the second voltage signal V02 have a same polarity, and an absolute value of a voltage value of the second voltage signal V02 is greater than an absolute value of a voltage value of the first voltage signal V01.

Figure 21:
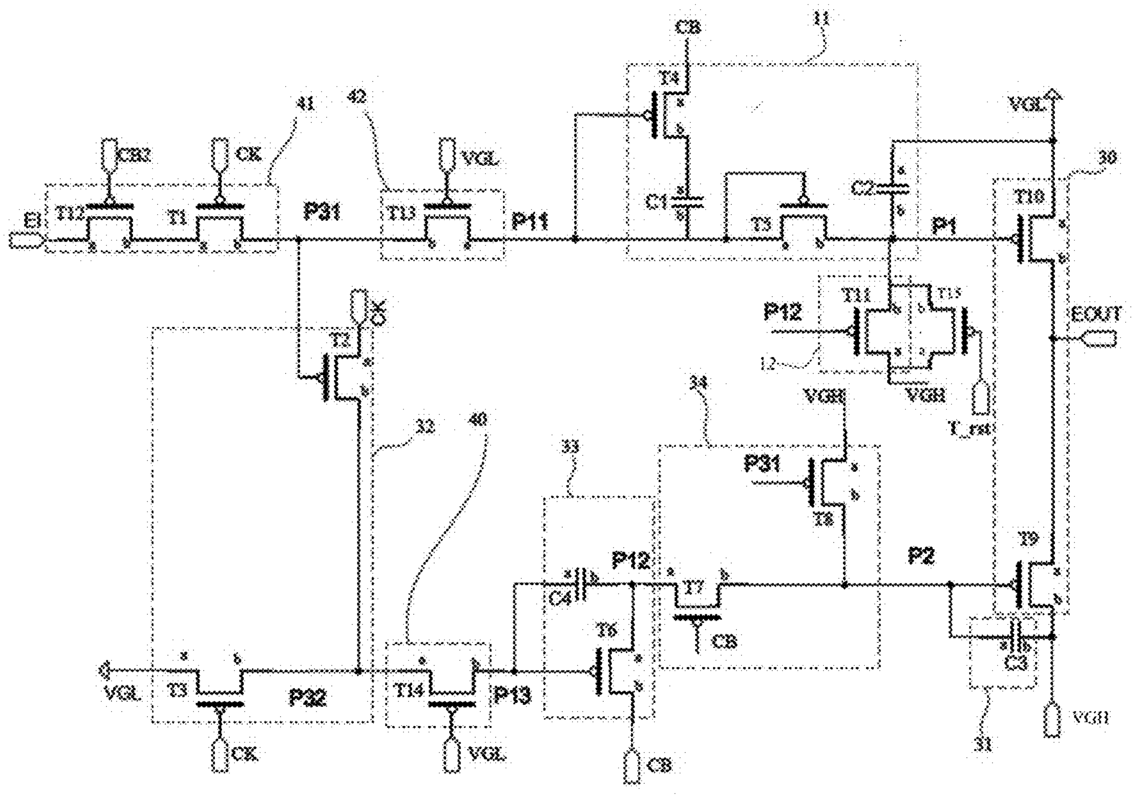

FIG. 21 is a schematic diagram of another circuit structure of a second shift register according to an embodiment of the present disclosure. As shown in FIG. 21, the second shift register not only includes the transistors T1 to T14 and the capacitors C1 to C4, but also includes a transistor T15. A control electrode of the transistor T15 is connected to a master reset control line T_rst, a first electrode of the transistor T15 is connected to the first electrode of the transistor T11, and a second electrode of the transistor T15 is connected to the second electrode of the transistor T11.

It should be noted that the transistors 15 in the second shift registers in all the stages in the second gate drive circuit 4 are connected to the master reset control line. Before the second gate drive circuit 4 starts to operate or during the Blanking Time between adjacent displayed frames, the transistors 15 in the second shift registers in all the stages are turned on under the control of the master reset control line T_rst, so that VGH is written to the first nodes P1 to realize reset all the first nodes P1 in all the second shift registers.

In some embodiments, the third shift register in the light emission control drive circuit 5 may also adopt the circuit structure of the second shift register shown in FIG. 19 or FIG. 20, that is, the circuit structure of the second shift register may be the same as that of the third shift register.

Of course, the circuit structure of the second shift register and that of the third shift register in the embodiments of the present disclosure are not limited to those shown in FIG. 19 and FIG. 21, and the second shift register and the third shift register may also adopt other circuit structures, which will not be listed herein.

The embodiments of the present disclosure further provide a display device including a display substrate in any one of the above embodiments, and reference may be made to the corresponding description of the above embodiments for a description of the display substrate, which will not be repeated here.

It should be noted that the display device may be any product or component having a display function, such as an OLED panel, an OLED television, an QLED panel, a QLED television, a mobile phone, a tablet computer, a notebook computer, a digital photo frame, and a navigator. The display device may further include other components, such as a data drive circuit and a timing controller, and those components are not limited in the embodiments of the present disclosure.

It should be noted that, for the purposes of clarity and conciseness, not all the components of the display device are described in the embodiments of the present disclosure. Other structures not shown may be provided and configured by those skilled in the art according to specific needs to realize basic functions of the display device, and those structures are not limited in the embodiments of the present disclosure.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A display substrate, comprising: an active region and a peripheral region surrounding the active region, wherein the active region is provided therein with a plurality of pixel units arranged in an array, all of the plurality of pixel units are divided into n pixel unit groups, each of the n pixel unit groups is provided with a corresponding first gate line and a corresponding reset signal line, the peripheral region is provided therein with a driver block comprising a first gate drive circuit, and the first gate drive circuit comprises (n+x) first signal output terminals configured to sequentially output first gate drive signals in an active level, with both n and x being positive integers, and x≥2; wherein the first gate line for controlling writing of a data voltage to each pixel unit in an $i^{th}$ pixel unit group is electrically connected to a $(i+x)^{th}$ first signal output terminal, and the reset signal line for controlling writing of a reset voltage to each pixel unit in the $i^{th}$ pixel unit group is electrically connected to an $i^{th}$ first signal output terminal of (n+x) first signal output terminals, with i being a positive integer and i≤n, the first gate drive circuit comprises (n+x) cascaded first shift registers, and a signal output terminal of the first shift register in a $(x+i)^{th}$ stage is a $(x+i)^{th}$ first signal output terminal, with i being a positive integer and i≤n, among the (n+x) first signal output terminals of the first gate drive circuit, the $(x+i)^{th}$ first signal output terminal of the first shift register in the $(x+i)^{th}$ stage is respectively connected to the reset signal line of each pixel unit in the $(x+i)^{th}$ pixel unit group for controlling writing, via the reset signal line, of the reset voltage to the pixel unit in the $(x+i)^{th}$ pixel unit group and connected to the first gate line of each pixel unit in the $i^{th}$ pixel unit group for controlling writing, via the first gate line, of the data voltage to the pixel unit in the $i^{th}$ pixel unit group, with i being a positive integer, i≤n, and x≥2.

2. The display substrate of claim 1, wherein the display substrate comprises two driver blocks respectively located on opposite sides of the active region, or the pixel units in a same row are located in a same pixel unit group, and the pixel units in different rows are located in different pixel unit groups.

3. A display device, comprising: the display substrate of claim 1.

4. The display substrate of claim 1, wherein each of the n pixel unit groups is provided with a corresponding second gate line, and the driver block further comprises a second gate drive circuit, the second gate drive circuit comprises n/a second signal output terminals configured to sequentially output second gate drive signals in an active level, with a being a positive integer, a<n, and n/a being a positive integer; and the second gate line provided for the $i^{th}$ pixel unit group is electrically connected to a $[i/a]^{th}$ second signal output terminal, with [i/a] representing rounding up an operation result of i/a.

5. The display substrate of claim 4, wherein the second gate drive circuit comprises: n/a cascaded second shift registers, and a signal output terminal of the second shift register in a $k^{th}$ stage is a $k^{th}$ second signal output terminal, with k being a positive integer and k<n/a.

6. The display substrate of claim 5, wherein an interval between a time when one of two adjacent first signal output terminals starts to output the first gate drive signal in an active level and a time when the other one of the two adjacent first signal output terminals successively starts to output the first gate drive signal in an active level is H, and an interval between a time when one of two adjacent second signal output terminals starts to output the second gate drive signal in an active level and a time when the other one of the two adjacent second signal output terminals successively starts to output the second gate drive signal in an active level is a*H; and the first gate drive signal is a monopulse signal, and duration when the first gate drive signal is in an active level duirng one period is t, and H>t.

7. The display substrate of claim 6, wherein, in a same frame, a time period during which the second gate drive signal output by the $k^{th}$ second signal output terminal is in an active level at least partially overlaps with a time period during which the first gate drive signal output by each of a $(a*k-a+1)^{th}$ first signal output terminal to a $(a*k)^{th}$ first signal output terminal is in an active level, and also at least partially overlaps with a time period during which the first gate drive signal output by each of a $(a*k-a+1+x)^{th}$ first signal output terminal to a $(a*k+x)^{th}$ first signal output terminal is in an active level.

8. The display substrate of claim 7, wherein in a same frame, a time when the $k^{th}$ second signal output terminal starts to output the second gate drive signal in an active level is prior to a time when the $(a*k-a+1)^{th}$ first signal output terminal starts to output the first gate drive signal in an active level, or in a same frame, a time when the $k^{th}$ second signal output terminal starts to output the second gate drive signal in an active level is the same as the time when the $(a*k-a+1)^{th}$ first signal output terminal starts to output the first gate drive signal in an active level.

9. The display substrate of claim 8, wherein the second gate drive signal is a monopulse signal during a frame; and duration when the second gate drive signal is in an active level during one period is (x+a)*H.

10. The display substrate of claim 8, wherein the second gate drive signal is a double-pulse signal during a frame;

in one period, the double-pulse signal comprises a first part in an active level, a second part in an inactive level and a third part in an active level, with the second part being between the first part and the third part;

in a same frame, a time period corresponding to the first part of the second gate drive signal output by the $k^{th}$ second signal output terminal at least partially overlaps with the time period during which the first gate drive signal output by each of the $(a*k-a+1)^{th}$ first signal output terminal to the $(a*k)^{th}$ first signal output terminal is in an active level; and a time period corresponding to the third part of the second gate drive signal output by the $k^{th}$ second signal output terminal at least partially overlaps with the time period during which the first gate drive signal output by each of the $(a*k-a+1+x)^{th}$ first signal output terminal to the $(a*k+x)^{th}$ first signal output terminal is in an active level.

11. The display substrate of claim 10, wherein duration of each of the first part and the third part is greater than or equal to a*H, a value of a is 2, x>4, and the duration of each of the first part and the third part is 3H.

12. The display substrate of claim 1, wherein each of the pixel unit groups is provided with a corresponding light emission control line, the driver block further comprises: a light emission control drive circuit having n/b third signal output terminals configured to sequentially output light emission control signals in an active level, with b being a positive integer, b<n, and n/b being a positive integer; and the light emission control line provided for the $i^{th}$ pixel unit group is electrically connected to a $[i/b]^{th}$ third signal output terminal, with [i/b] representing rounding up an operation result of i/b.

13. The display substrate of claim 12, wherein the light emission control drive circuit comprises: n/b cascaded third shift registers; and a signal output terminal of the third shift register in a $p^{th}$ stage is a $p^{th}$ third signal output terminal, with p being a positive integer and p≤n/b.

14. The display substrate of claim 13, wherein an interval between a time when one of two adjacent first signal output terminals starts to output the first gate drive signal in an active level and a time when the other one of the two adjacent first signal output terminals successively starts to output the first gate drive signal in an active level is H, and an interval between a time when one of two adjacent third signal output terminals starts to output the light emission control signal in an active level and a time when the other one of the two adjacent third signal output terminals successively starts to output the light emission control signal in an active level is b*H; and the first gate drive signal is a monopulse signal, and the duration when the first gate drive signal is in an active level during one period is t, and H≥t, the light emission control signal is a monopulse signal, and duration when the light emission control signal is in an inactive level during one period is greater than or equal to (x+b)*H, with a value of b being 1 or 2.

15. The display substrate of claim 14, wherein, in a same frame, a time period during which the light emission control signal output by the $p^{th}$ third signal output terminal is in an inactive level overlaps with an entire time period from a time when a $(b*p-b+1)^{th}$ first signal output terminal starts to output the first gate drive signal in an active level to a time when a $(b*p+x)^{th}$ first signal output terminal stops outputting the first gate drive signal in an active level.

16. The display substrate of claim 1, wherein each pixel unit in the $i^{th}$pixel unit group comprises: a pixel circuit and a light emitting device, and the pixel circuit comprises: a first reset sub-circuit, a second reset sub-circuit, a data write sub-circuit, a threshold compensation sub-circuit, and a driving transistor;

the first reset sub-circuit is connected to a first reset power terminal, a control electrode of the driving transistor, and the reset signal line connected to the ith first signal output terminal of the first gate drive circuit respectively, and the first reset sub-circuit is configured to write a first reset voltage provided by the first reset power terminal to the control electrode of the driving transistor under the control of the reset signal line;

the second reset sub-circuit is connected to a second reset power terminal, a first terminal of the light emitting device, and the reset signal line connected to the $i^{th}$ first signal output terminal of the first gate drive circuit respectively, and the second reset sub-circuit is configured to write a second reset voltage provided by the second reset power terminal to the first terminal of the light emitting device under the control of the reset signal line;

the data write sub-circuit is connected to a first electrode of the driving transistor, a data line, and the first gate line connected to the $(i+x)^{th}$ first signal output terminal of the first gate drive circuit respectively, and the data write sub-circuit is configured to write a data voltage provided by the data line to the first electrode of the driving transistor under the control of the first gate line;

the threshold compensation sub-circuit is connected to a second operating power terminal, the control electrode of the driving transistor, the first electrode of the driving transistor, a second electrode of the driving transistor, and a first gate line respectively, and the threshold compensation sub-circuit is configured to write a data compensation voltage, which is equal to a sum of the data voltage and a threshold voltage of the driving transistor, to the control electrode of the driving transistor under the control of the first gate line;

the second electrode of the driving transistor is connected to the first terminal of the light emitting device, and the driving transistor is configured to output a driving current under the control of the data compensation voltage; and a second terminal of the light emitting device is connected to a first operating power terminal.

17. The display substrate of claim 16, wherein the first reset sub-circuit comprises a first transistor, the second reset sub-circuit comprises a second transistor, the data write sub-circuit comprises a third transistor, and the threshold compensation sub-circuit comprises a fourth transistor and a fifth transistor;

a control electrode of the first transistor is connected to the reset signal line, a first electrode of the first transistor is connected to the first reset power terminal, and a second electrode of the first transistor is connected to the control electrode of the driving transistor;

a control electrode of the second transistor is connected to the reset signal line, a first electrode of the second transistor is connected to the second reset power terminal, and a second electrode of the second transistor is connected to the first terminal of the light emitting device;

a control electrode of the third transistor is connected to the first gate line, a first electrode of the third transistor is connected to the data line, and a second electrode of the third transistor is connected to the first electrode of the driving transistor;

a control electrode of the fourth transistor is connected to a light emission control signal line, a first electrode of the fourth transistor is connected to the second operating power terminal, and a second electrode of the fourth transistor is connected to the first electrode of the driving transistor; and a control electrode of the fifth transistor is connected to the first gate line, a first electrode of the fifth transistor is connected to the control electrode of the driving transistor, and a second electrode of the fifth transistor is connected to the second electrode of the driving transistor.

18. The display substrate of claim 17, wherein the pixel circuit further comprises a sixth transistor, the second electrode of the driving transistor is connected to the first terminal of the light emitting device through the sixth transistor; and a control electrode of the sixth transistor is connected to the light emission control signal line, a first electrode of the sixth transistor is connected to the second electrode of the driving transistor, and a second electrode of the sixth transistor is connected to the first terminal of the light emitting device.

19. The display substrate of claim 18, wherein the pixel circuit further comprises a seventh transistor, and the first electrode of the fifth transistor and the second electrode of the first transistor are both connected to the control electrode of the driving transistor through the seventh transistor; and a control electrode of the seventh transistor is connected to a second gate line, a first electrode of the seventh transistor is connected to the first electrode of the fifth transistor and the second electrode of the first transistor, and a second electrode of the seventh transistor is connected to the control electrode of the driving transistor, the seventh transistor is an N-type transistor, and the remaining transistors in the pixel circuit except for the seventh transistor are all P-type transistors.

* * * * *